(12) United States Patent
Tadepalli et al.

(10) Patent No.: US 11,448,686 B2
(45) Date of Patent: Sep. 20, 2022

(54) RDSON/DRON MEASUREMENT METHOD AND CIRCUIT FOR HIGH VOLTAGE HEMTS

(71) Applicant: Texas Instruments Incorporated, Dallas, TX (US)

(72) Inventors: Ramana Tadepalli, McKinney, TX (US); Alexander George Atkins Smith, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/023,723

(22) Filed: Sep. 17, 2020

(65) Prior Publication Data

US 2021/0080498 A1 Mar. 18, 2021

Related U.S. Application Data

(60) Provisional application No. 62/902,056, filed on Sep. 18, 2019.

(51) Int. Cl.
*G01R 31/26* (2020.01)
*G01R 31/28* (2006.01)

(52) U.S. Cl.
CPC ..... *G01R 31/2623* (2013.01); *G01R 31/2837* (2013.01)

(58) Field of Classification Search
CPC ............ G01R 31/2623; G01R 31/2837; G01R 31/2621
USPC .................................................... 324/762.09
See application file for complete search history.

(56) References Cited

U.S. PATENT DOCUMENTS

| 10,094,863 | B2 | 10/2018 | Bahl et al. | |
|---|---|---|---|---|
| 2016/0069946 | A1* | 3/2016 | Ikeda | H01L 29/7787 324/762.09 |
| 2017/0254842 | A1* | 9/2017 | Bahl | G01R 19/0084 |
| 2017/0276724 | A1 | 9/2017 | Tadepalli | |
| 2017/0279211 | A1 | 9/2017 | Tadepalli | |
| 2017/0307681 | A1 | 10/2017 | Tadepalli | |
| 2019/0011493 | A1* | 1/2019 | Paikin | G01R 31/2642 |
| 2021/0063469 | A1* | 3/2021 | Nakamura | G01R 31/2621 |

* cited by examiner

*Primary Examiner* — Tung X Nguyen
*Assistant Examiner* — Robert P Alejnikov, Jr.
(74) *Attorney, Agent, or Firm* — Ronald O. Neerings; Charles A. Brill; Frank D. Cimino

(57) ABSTRACT

A test system, a method for manufacturing an electronic device, and a method for testing a wafer or electronic device that includes coupling a transistor in a series circuit with a capacitor and a resistor, coupling a voltage source to the capacitor to charge the capacitor to a non-zero DC voltage while the transistor is turned off, disconnecting the voltage source from the capacitor while the transistor is turned off, turning the transistor on while the voltage source is disconnected from the capacitor, measuring a voltage signal across the resistor while the transistor is turned on, and determining a test result indicating whether the transistor has an acceptable dynamic on-state resistance according to the voltage signal across the resistor.

31 Claims, 14 Drawing Sheets

RDSON/DRON MEASUREMENT METHOD AND CIRCUIT FOR HIGH VOLTAGE HEMTS

CROSS-REFERENCE TO RELATED APPLICATION

Under 35 U.S.C. § 119, this application claims priority to, and the benefit of, U.S. provisional patent application No. 62/902,056, entitled "RDSON/dDRON MEASUREMENT METHOD & CIRCUIT FOR HIGH VOLTAGE HEMTS", and filed on Sep. 18, 2019, the entirety of which is hereby incorporated by reference.

BACKGROUND

Transistors are produced as single component electronic devices and are included with other components in integrated circuit electronic devices. It is beneficial to test transistors during and/or after manufacturing to identify devices with expected performance parameters and screen out devices that do not meet required specifications. Power converters and other high voltage switching applications use transistors as switches that are subjected to high voltages during an off state, and are turned on to conduct current, for example, using pulse width modulation (PWM) to regulate an output voltage signal. High electron mobility transistors (HEMTS), such as silicon field effect transistor (FETs), silicon carbide (SiC) FETs, gallium nitride (GaN) FETs, insulated gate bipolar transistors (IGBTs) and the like can be used in such applications. Important performance parameters of high voltage transistors include on-state resistance, such as drain-source on-state resistance (RDSON) of a FET, as well as dynamic on-state resistance or dynamic RDSON (dRON). Testing transistors for RDSON and dRON is difficult in manufacturing, both at wafer probe and final test, due to the high off-state voltage across the source and drain terminals of an FET, and switching to measure the transistor resistance at high drain-source current flow and low drain-source voltage levels when the transistor is turned on. One particular challenge in measuring dRON is the high dynamic range and high voltage tolerance required to measure the drain-source voltage (VDS) with a tester instrument, for example, 1 kV off and 200 mV on for a 1 A supply and an RDSON on the order of about 150 mQ. Two different power supplies can be used, such as one to provide high voltage in the off state and a second supply to provide high current in the on state, but this requires transitioning between the two power supplies as the transistor switches, which is difficult for high speed switching transitions such as 100V/ns. Moreover, the RDSON for GaN and other HEMTs is not static when the transistor is turned on and RDSON can vary from one transistor to another during fabrication. For example, trapped charges and other mechanisms in defective transistors can cause RDSON to be higher immediately after switching the transistor on, which leads to added power lost to resistance in the transistor, as well as possible overheating and shortened life span in use.

SUMMARY

In accordance with one aspect, a test system includes a voltage source, a switch circuit, a capacitor and a resistor, as well as a gate drive circuit, a signal processing circuit and a control circuit. The voltage source has a first terminal and a second terminal coupled to a reference voltage node. The switch circuit has a contact with first and second contact terminals, as well as a control input. The second contact terminal is adapted to be coupled to a first terminal of a transistor of a device under test (DUT), such as a wafer DUT or a packaged electronic device DUT. A first terminal of the capacitor is coupled to the second contact terminal, and a second terminal of the capacitor is coupled to the reference voltage node. A first terminal of the resistor is adapted to be coupled to a second terminal of the DUT transistor, and a second terminal of the resistor is coupled to the reference voltage node. The gate drive circuit has a control input and an output that is adapted to be coupled to a gate terminal of the DUT transistor. The signal processing circuit has first and second inputs, an output, and a control input. The first input is coupled to the first terminal of the resistor, and the second input is coupled to the second terminal of the resistor. The control circuit has first, second and third outputs. The first output of the control circuit is coupled to the control input of the switch circuit. The second output of the control circuit is coupled to the control input of the gate drive circuit. The third output of the control circuit is coupled to the control input of the signal processing circuit.

In accordance with another aspect, a method includes coupling a transistor in a series circuit with a capacitor and a resistor, coupling a voltage source to the capacitor to charge the capacitor to a non-zero DC voltage while the transistor is turned off, and disconnecting the voltage source from the capacitor while the transistor is turned off. The method also includes turning the transistor on while the voltage source is disconnected from the capacitor, measuring a voltage signal across the resistor while the transistor is turned on, and determining a test result indicating whether the transistor has an acceptable dynamic on-state resistance according to the voltage signal across the resistor.

In accordance with yet another aspect, a method of manufacturing an electronic device includes processing a wafer to fabricate a transistor on or in the wafer, separating a die from the wafer, the die includes the transistor, and packaging the die to create a packaged electronic device. The method also includes coupling the transistor in a series circuit with a capacitor and a resistor, coupling a voltage source to the capacitor to charge the capacitor to a non-zero DC voltage while the transistor is turned off, disconnecting the voltage source from the capacitor while the transistor is turned off, turning the transistor on while the voltage source is disconnected from the capacitor, measuring a voltage signal across the resistor while the transistor is turned on, and determining a test result indicating whether the transistor has an acceptable dynamic on-state resistance according to the voltage signal across the resistor.

DETAILED DESCRIPTION

Figure 1:
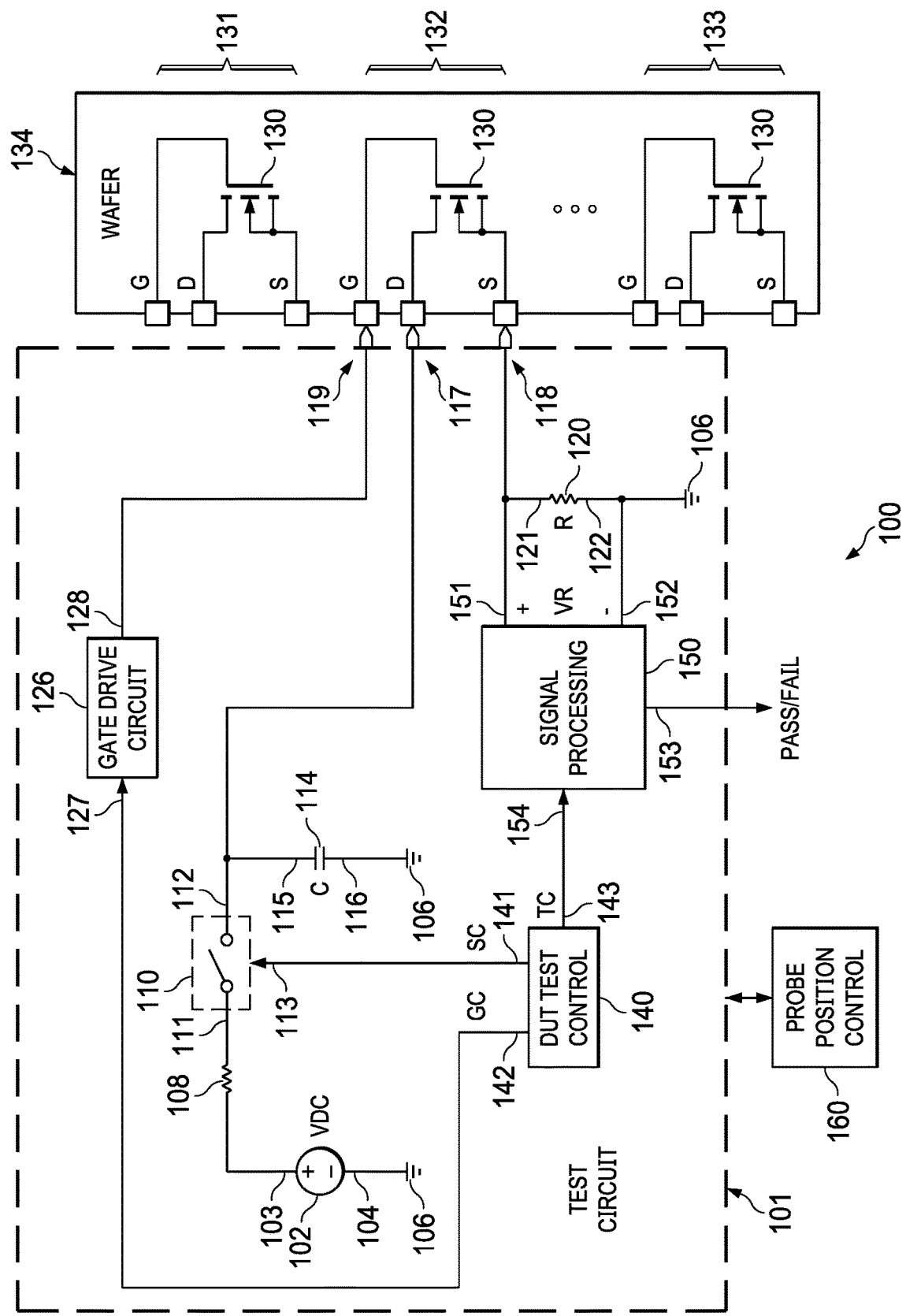
FIG. 1 is a schematic diagram of a wafer probe test system for testing transistors of a wafer device under test (DUT).

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Described examples include test systems, test methods, and electronic device manufacturing techniques that can facilitate testing production transistors at wafer test and/or final test for dynamic on-state resistance (e.g., FET dRON) using available automatic test equipment (ATE) for every die in a wafer. The described methods and systems can also be used for RDSON measurements, and can be employed in the manufacture of any form of transistor, such as GaN, Si and/or SiC HEMTs, IGBTs, etc.

FIG. 1 shows a wafer probe test system 100 (e.g., wafer probe tester) with a test circuit 101 that can be used for testing transistors of a wafer DUT, as well as for final testing of transistors of packaged electronic device DUTs. The test system 100 includes a voltage source 102 that includes a first terminal 103 (e.g., labeled "+" in the drawings) and a second terminal 104 (e.g., labeled "−") that is coupled to a reference voltage node 106 (e.g., a circuit ground or common connection). The voltage source 102 in one example is an adjustable DC power supply capable of providing an output voltage signal VDC having an amplitude of 1 kV or more for testing dynamic on-state resistance of high-voltage switching transistors of a connected DUT. The example test circuit also includes a current limiting resistor 108 coupled between the first terminal 103 and a switch circuit 110. The switch circuit 110 includes a contact with a first contact terminal 111 coupled to the resistor 108 and a second contact terminal 112, as well as a control input 113. The second contact terminal 112 is adapted to be coupled to a first terminal (e.g., an FET drain labeled "D") of a tested transistor. The test circuit 101 also includes a capacitor 114 having a capacitance C. A first terminal 115 of the capacitor 114 is coupled to the second contact terminal 112, and a second terminal 116 of the capacitor is coupled to the reference voltage node 106.

The voltage source 102, the current limiting resistor 108, the switch circuit 110 and the capacitor 114 are coupled in a first series circuit that operates when the switch circuit 110 is closed to charge the capacitor 114 to or near the voltage VDC of the voltage source 102, or to another desired final capacitor voltage depending on the length of time the switch circuit 110 is closed. During charging, the tested transistor is turned off, and the current limiting resistor 108 limits the charging current applied to the capacitor 114. The resistance value of the resistor 108 can be tailored to a desired charging time and a current rating of the capacitor 114. In another example, the resistor 108 is omitted, and the first terminal 103 of the voltage source 102 is coupled directly to the first contact terminal 111 of the switch circuit 110.

The test system 100 in FIG. 1 includes or is electrically coupled to wafer probe pins or needles 117, 118 and 119. The wafer probe pins 117, 118 and 119 are adapted to make electrical contacts to respective drain (D), source (S) and gate (G) terminals of a tested transistor as illustrated in FIG. 1, and the test circuit 101 is mounted to a wafer probe head that operates to selectively engage the probe pins 117, 118 and 119 with corresponding conductive pads or other conductive features of a tested wafer DUT, allowing repositioning of the test circuit 101 to sequentially engage and test multiple transistors in one or more die areas of a fabricated wafer during wafer probe testing. As illustrated and described further below in connection with FIGS. 17 and 18, the test circuit 101 can be similarly included in a final test system with socket connections for a tested transistor or transistors of a packaged electronic device DUT.

The test system 100 also includes a resistor 120 having a first terminal 121 and a second terminal 122, and a resistance R. The first terminal 121 is adapted to be coupled to a second terminal (e.g., the source labeled "S") of the tested transistor. The second terminal 122 of the resistor 120 is coupled to the reference voltage node 106. When the switch circuit 110 is opened and the tested transistor is turned on, the capacitor 114, the tested transistor and the resistor 120 form a second series circuit. The second series circuit discharges the capacitor 114 through the tested transistor and the resistor 120 when the switch circuit 110 is opened and the tested transistor is turned on. The resulting current flowing through the drain-source channel of the tested transistor develops a voltage signal VR across the first and second terminals 121 and 122 of the resistor 120.

The test system 100 further includes a gate drive circuit 126 having a control input 127 and an output 128. The output 128 of the gate drive circuit 126 adapted to be coupled to a gate terminal of a tested transistor 130 via the probe pin 119. The connected transistor 130 is one of multiple transistors 130 in respective die areas 131, 132 and 133 of a wafer DUT 134. Any number of one or more transistors 130 can be within a given one of the die areas 131-133, and the wafer DUT 134 can have any number of one or more die areas. The example transistors 130 in FIG. 1 are enhancement mode GaN transistors. The test system 100 can be used for testing any variety of FETs or IGBTs, for example, GaN transistors, n-channel FETs and p-channel FETs. Moreover, the test system 100 can be used to test enhancement mode and/or depletion mode transistors. The tested transistor or transistors 130 can be any form of FET or IGBT, such as GaN, Si and/or SiC HEMTs, etc.

The test system 100 also includes a control circuit 140 (e.g., labeled "DUT TEST CONTROL" in FIG. 1). The control circuit 140 in one example is or includes logic circuitry to implement state machines or other operations, analog interface and signal conditioning circuits, timing circuitry and/or programmed or programmable circuits. In one example, the control circuit 140 includes a processor and associated electronic memory with program instructions stored in the memory for execution by the processor, along with analog interface circuits to generate various output signals as described further below. The control circuit 140 in one or more examples includes communications interface circuitry to communicate with external circuits, such as position control circuits and/or a host controller (not shown) of a wafer test system or of an electronic device final test system. The control circuit 140 includes a first output 141, a second output 142 and a third output 143. The first output 141 is coupled to the control input 113 of the switch circuit 110 to provide a switch control signal SC to the switch circuit 110. The second output 142 of the control circuit 140 is coupled to the control input 127 of the gate drive circuit 126 and operates to provide a gate control signal GC to the gate control circuit 126.

The test system 100 further includes a signal processing circuit 150. The signal processing circuit 150 receives the voltage signal VR from the resistor 120, along with the timing control signal TC from the control circuit 140. The signal processing circuit 150 provides a pass or fail signal at an output 153 (e.g., PASS/FAIL signal in FIG. 1) that indicates whether the tested transistor 130 has an acceptable dynamic on-state resistance dRON at least partially according to the voltage signal VR across the resistor 120. The signal processing circuit 150 in various implementations includes analog circuits, digital logic circuits, timing circuits, processor circuits, or combinations thereof. FIGS. 7, 10, 13 and 15 illustrate several example implementations of the signal processing circuit 150.

The signal processing circuit 150 includes a first input 151, a second input 152, an output 153 and a control input 154. The first input 151 of the signal processing circuit 150 is coupled to the first terminal 121 of the resistor 120 and the second input 152 is coupled to the second terminal 122 of the resistor 120. The third output 143 of the control circuit 140 is coupled to the control input 154 of the signal processing circuit 150. In this example, the third output 143 provides a timing control signal TC to the control input 154 of the signal processing circuit 150.

In certain examples, the control circuit 140 controls relative timing between edges of the timing control signal TC and the gate control signal GC. The signal processing circuit 150 provides a pass or fail signal with one of two possible states that indicate whether the tested transistor 130 has an acceptable dRON according to the voltage signal VR and according to the timing control signal TC.

The wafer probe test system 100 in this example includes the test circuit 101 with the voltage source 102, the switch circuit 110, the capacitor 114, the resistor 120, the gate drive circuit 126, the signal processing circuit 150, and the control circuit 140. The wafer probe test system 100 also includes the wafer probe pins 117, 118 and 119 coupled to respective ones of the second contact terminal 112, the first terminal 121 of the resistor 120, and the output 128 of the gate drive circuit 126. The test system 100 in one example also includes a probe position controller 160 (e.g., labeled "PROBE POSITION CONTROL" in FIG. 1). The probe position controller 160 moves the test circuit 101 and the probe pins 117, 118 and 119 on a probe head to select positions relative to the tested wafer DUT 134 to engage and couple the probe pins 117, 118 and 119 to specific conductive features coupled to the tested transistor 130, allowing sequential testing of one some or all transistors 130 of a given wafer DUT 134. The probe position controller 160 in one example also communicates with the test circuit 101 (e.g., with the control circuit 140) to initiate or allow a transistor test once the test circuit wafer probe pins 117, 118 and 119 are properly engaged to provide electrical connection to the terminals of the tested transistor 130.

Referring also to FIGS. 2-6, in operation, the test system 100 implements an automated production test after a wafer DUT 134 has been processed. The PASS/FAIL signal in one example is used by a host circuit (not shown) of a wafer probe test or final device test system to identify certain transistors 130 that have acceptable dRON performance, as well as to screen out transistors 130 that have unacceptable dRON performance. In one example, die areas 131, 132 or 133 of a given wafer DUT 134 that have one or more transistors 130 that do not pass the dRON testing a wafer probe can be discarded following die singulation or separation without any subsequent packaging or final tests in order to reduce manufacturing costs.

Figure 2:
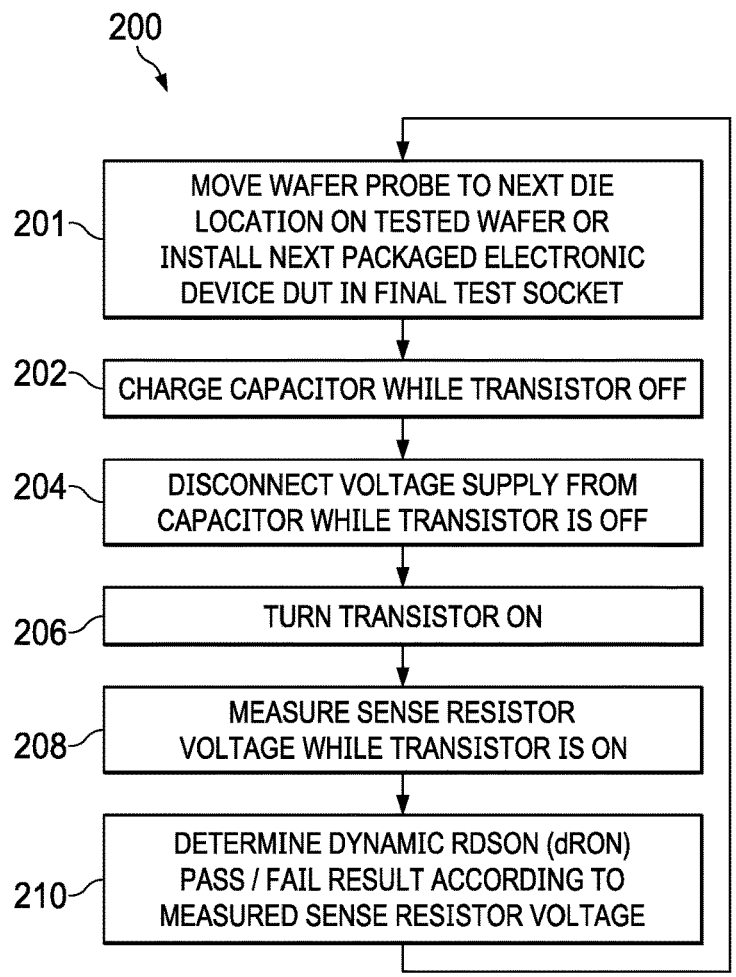
FIG. 2 is a flow diagram of a method for testing dynamic on-state resistance of a transistor.

FIG. 2 shows a method 200 for testing dynamic on-state resistance of a transistor. FIGS. 3-6 illustrate implementation of a wafer probe test using the test system 100 according to the method 200. In another implementation, the method 200 is used for testing packaged electronic devices using a socket, as illustrated and described further below in connection with FIGS. 17 and 18. The method 200 in FIG. 2 includes moving the wafer probe to a next die location at 201. In the final test implementation, a next packaged electronic device DUT is installed in a test system socket at 201. In FIG. 1, the wafer probe and the associated test circuit 101 are illustrated in a position that engages the probe pins 117-119 to the transistor 130 at the second die location 132. This couples the transistor 130 in a series circuit with the capacitor 114 and the resistor 120.

Figure 3:
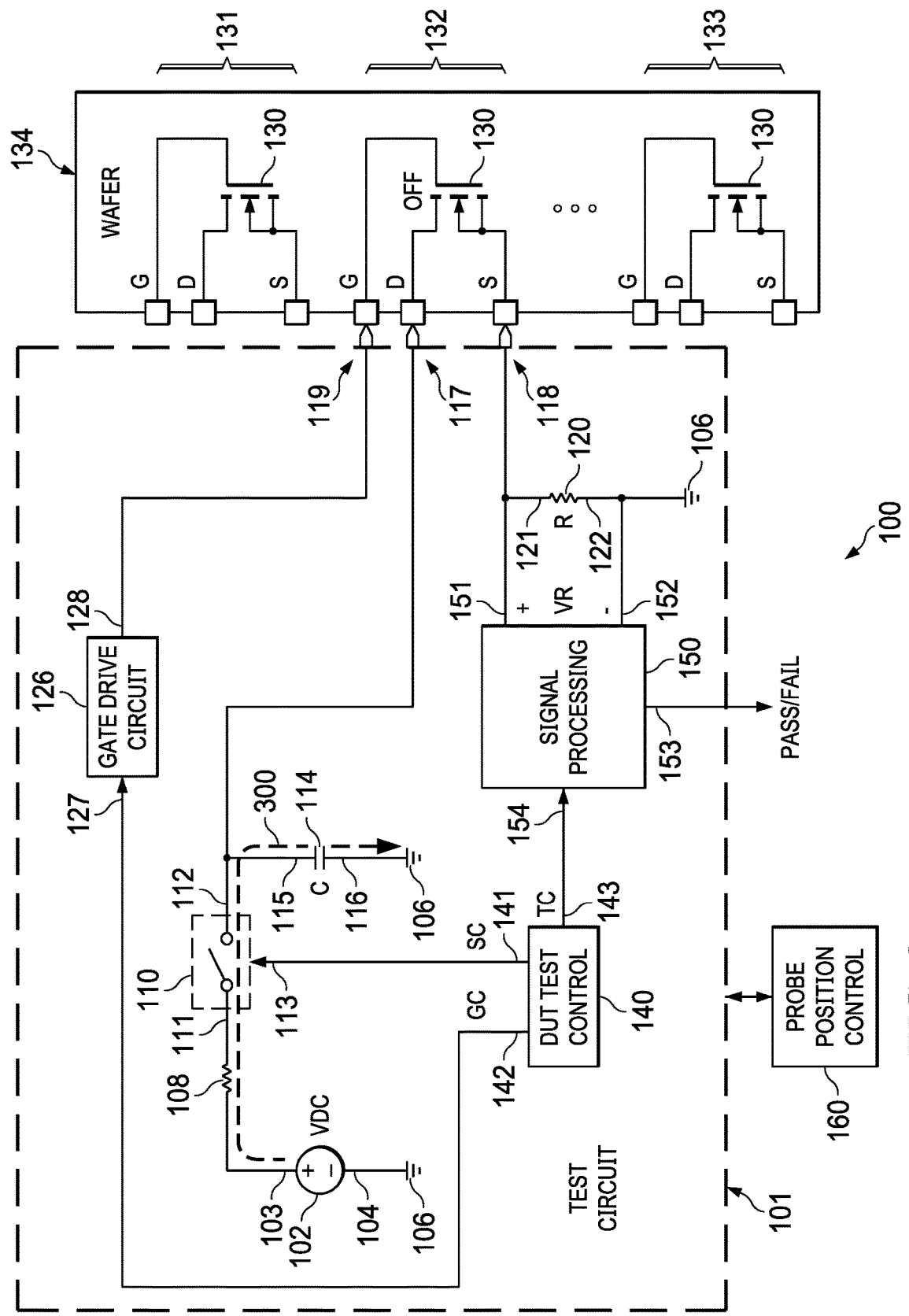
FIG. 3 is a schematic diagram of the wafer probe test system of FIG. 1 with a switch contact closed to charge a capacitor.

The method 200 continues at 202 with charging the capacitor while the DUT (e.g., the transistor 130) is turned off. FIG. 3 shows the test system 100 with the connected transistor 130 turned off (e.g., the gate drive signal held off in this example), and the control circuit 140 asserts the switch control signal SC at the first output 141 in order to close the contact of the switch circuit 110. In operation, the first output 141 of the control circuit 140 delivers the switch control signal SC to the control input 113 of the switch circuit 110 to initially close the contact and couple the first terminal 103 of the voltage source 102 to the first terminal 115 of the capacitor 114. This electrically connects a first and second contact terminals 111 and 112 to one another and connects the first terminal 103 of the voltage source 102 and the current limiting resistor 108 in a series circuit with the capacitor 114, and causes current to flow from the first terminal 103 of the voltage source 102 through the capacitor 114 along a current path 300 in FIG. 3. The control circuit 140 in one example maintains the switch circuit 110 in the closed state or position for a predetermined time to charge the capacitor 114 to a non-zero DC voltage while the transistor 130 is turned off.

Figure 4:
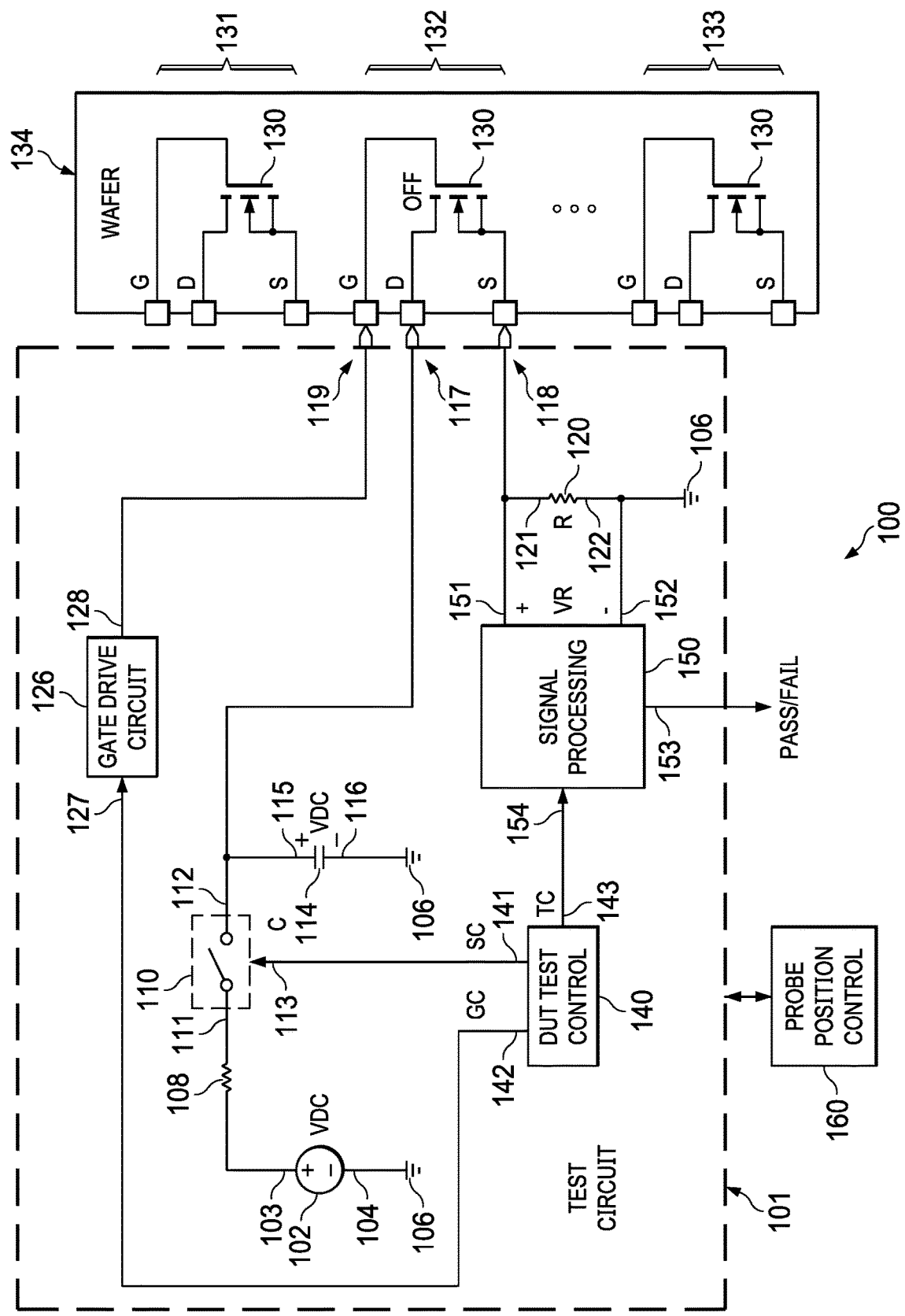
FIG. 4 is a schematic diagram of the wafer probe test system of FIGS. 1 and 3 with the switch contact open and the capacitor charged to a DC voltage.

The method 200 continues at 204 and FIG. 2 with disconnecting the voltage source 102 from the capacitor while the transistor 130 is turned off. FIG. 4 shows the system 100 with the switch circuit 110 changed to the open position after the capacitor 114 is charged to or near the voltage VDC of the voltage source 102. In other implementations, the capacitor 114 is charged to a different non-zero voltage that is less than VDC. The control circuit 140 in this example opens the contact of the switch circuit 110 after the capacitor 114 is charged, in order to disconnect the first terminal 103 of the voltage source 102 from the first terminal 115 of the capacitor 114 while the transistor 130 is turned off. In one example, the control circuit 140 asserts the switch control signal SC for a predetermined time in each test cycle. In another implementation, the control circuit 140 provides closed loop control of the charging of the capacitor 114 using a feedback signal (not shown), and opens the contact of the switch circuit 110 in response to the feedback signal indicating that the voltage of the capacitor 114 has reached a desired predetermined voltage.

Figure 5:
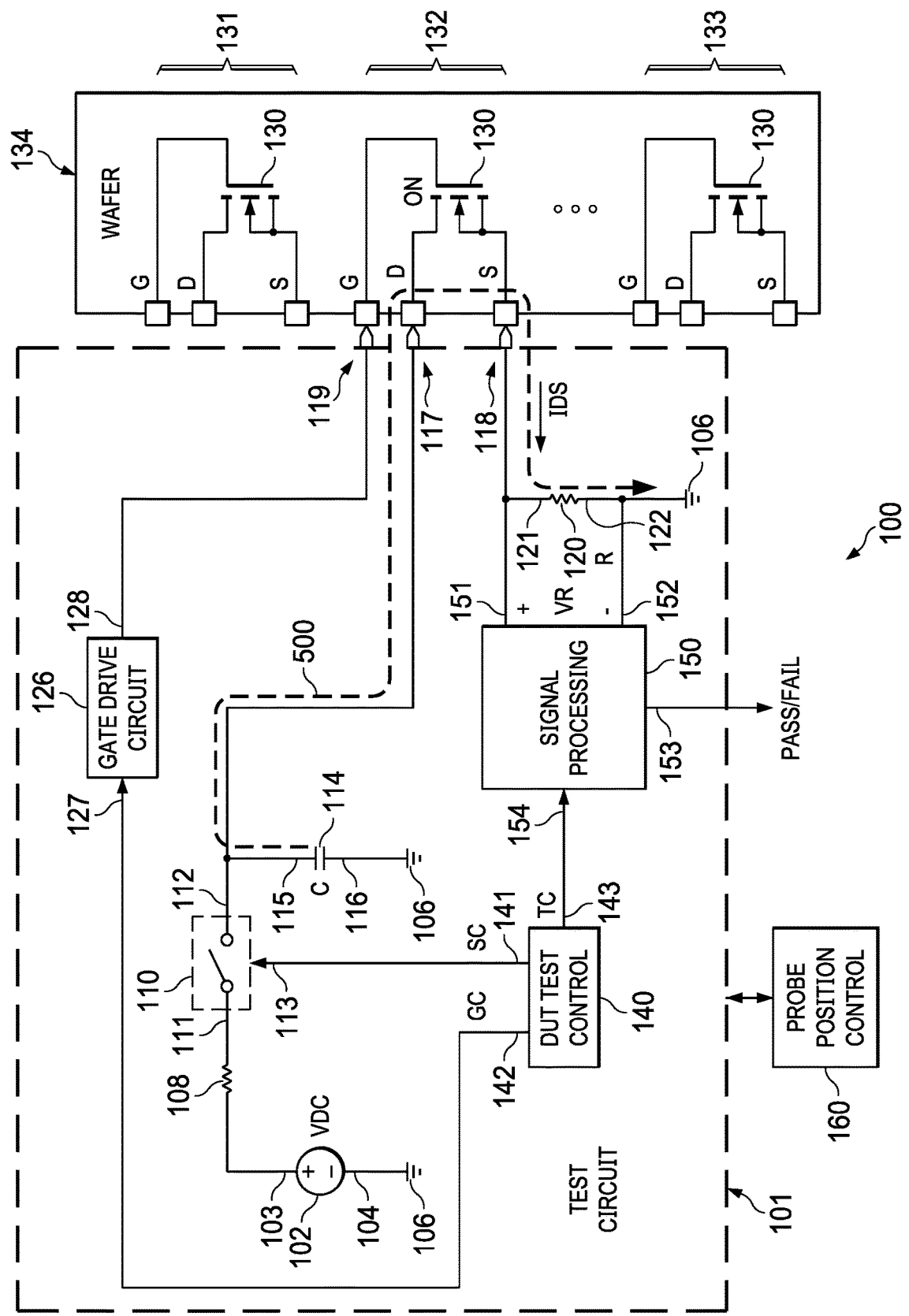
FIG. 5 is a schematic diagram of the wafer probe test system of FIGS. 1, 3 and 4 with a tested transistor turned on to conduct current from the charged capacitor through the transistor and through a sense resistor.

The method 200 continues at 206 in FIG. 4 with turning the tested transistor 130 on while the contact of the switch circuit 110 remains in the open state or position. FIG. 5 shows the system 100 with the switch circuit contact open, and the tested transistor 130 turned on, for example, by a gate control signal GC from the gate drive circuit 126. In this example, the second output 142 of the control circuit 140 delivers the gate control signal GC to the control input 127 of the gate drive circuit 126 to cause the gate drive circuit 126 to turn the transistor 130 on after the capacitor 114 is charged and while the contact of the switch circuit 110 is open. This completes the series circuit of the capacitor 114, the transistor 130 and the resistor 120, and allows a current signal IDS to flow along a current path 500 in FIG. 5 from the first terminal 115 of the previously charged capacitor 114 through the transistor 130 and through the resistor 120. The current flow through the resistor 120 develops the voltage signal VR across the resistor 120.

Figure 6:
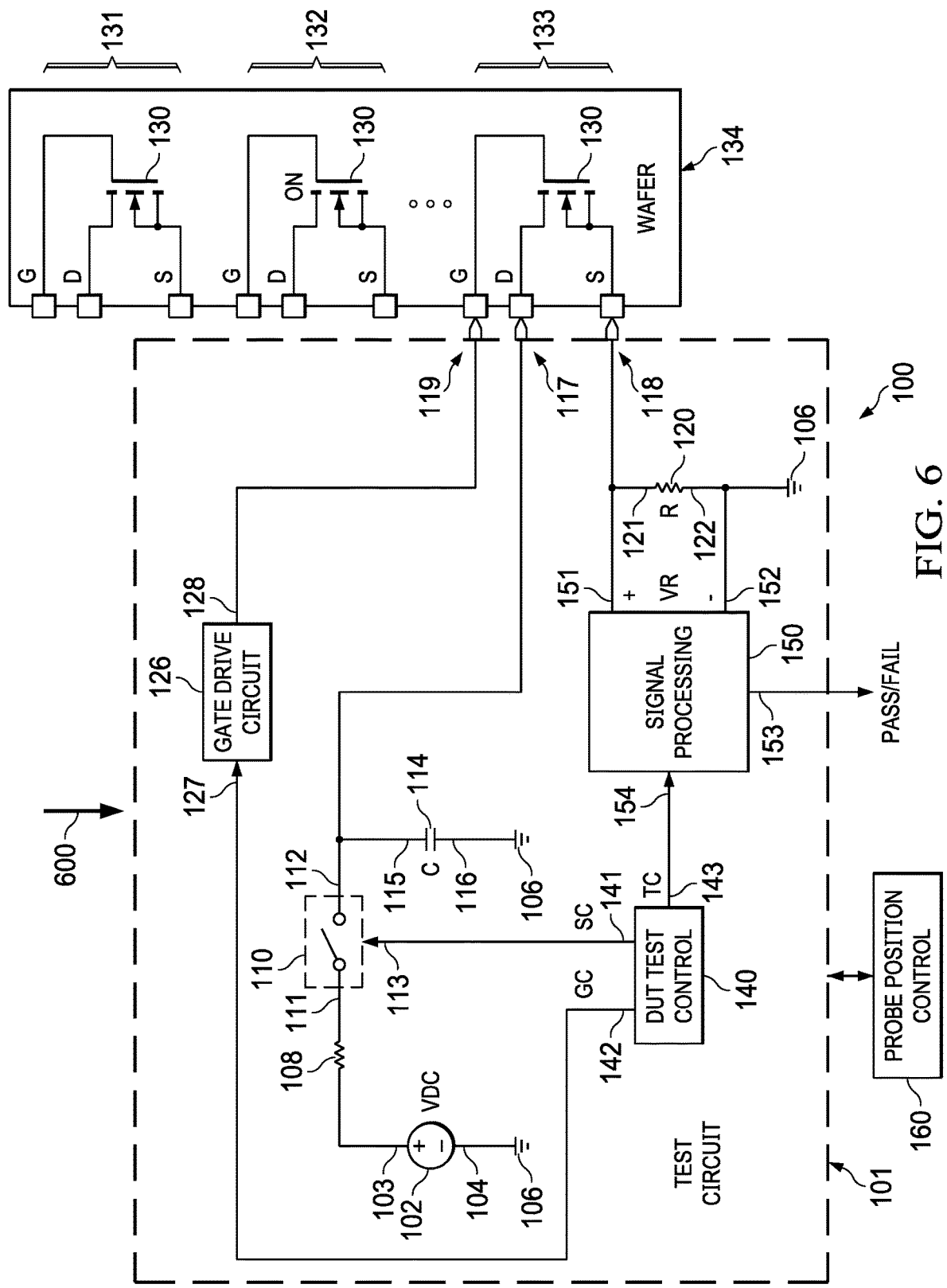
FIG. 6 is a schematic diagram of the wafer probe test system of FIGS. 1 and 3-5, with a wafer probe head moved to engage a second transistor of the wafer.

The method 200 also includes measuring a voltage signal across the resistor while the transistor is turned on at 208 in FIG. 2. In one example, the third output 143 of the control circuit 140 delivers the timing control signal TC to the control input 154 of the signal processing circuit 150 at a fixed temporal relationship to the gate control signal GC of the second output 142. The signal processing circuit 150 measures the resistor voltage signal VR and determines a test result at 210 that indicates whether the transistor has an acceptable dynamic on-state resistance according to the voltage signal across the resistor. The method 200 then returns to move the wafer probe head to the next die location at 201 and the process repeats for all selected die locations of the wafer DUT 134. FIG. 6 shows the test system 100 with the probe pins 117-119 and the test circuit 101 moved to the next die location 133 for testing the next transistor 130.

The signal processing circuit 150 generates the test result signal PASS/FAIL at the output 153 in response to the voltage signal VR across the resistor 120 and the timing control signal TC. In one example, the test result signal PASS/FAIL has two distinct states, including a first state (PASS) and a second state (FAIL). The first state indicates an acceptable dynamic on-state resistance dRON of the transistor 130, and the second state indicates an unacceptable dynamic on-state resistance dRON of the transistor 130.

As described below in connection with FIGS. 7-15, a variety of different signal processing circuits 150 can be used, including analog circuitry with timing control, counter circuitry, processors with analog-to-digital converters (ADCs) and/or combinations thereof in order to assess the dynamic behavior of the on-state resistance of the tested transistor 130 as the capacitor 114 discharges. In one example, the signal processing circuit 150 measures the voltage signal VR at a predetermined time following the transistor 130 turning on, in response to the timing control signal TC from the control circuit 140. In another example, the signal processing circuit 150 determines a time after the transistor 130 turns on, at which the voltage signal VR reaches a predetermined voltage.

In other examples, the signal processing circuit 150 determines whether the dynamic on-state resistance dRON is acceptable or not based on time and voltage values. In further examples, the signal processing circuit 150 integrates the voltage signal VR and determines whether the tested transistor 130 passes or fails based on the integrated voltage. In one implementation, the signal processing circuit 150 includes timing circuitry (e.g., a time measurement unit TMU) that measures the voltage VR at a delay of an integer number of RC time constants (e.g., n×RC) after the transistor 130 is turned on. This implementation facilitates using a measurement instrument threshold that is much lower than the total voltage input dynamic range. In one example, the capacitor 114 is initially charged to approximately 1 kV, and the on-state resistance (e.g., RDSON) of the transistor 130 is approximately 50-150 mΩ. With known values for the charged capacitor voltage (e.g., VDC), the capacitance of the capacitor 114 (C) and the resistance R of the resistor 120, the voltage signal VR will be approximately 1 kV when the transistor 130 is initially turned on, and gradually decreases according to the RC time constant of the connected circuit.

Figure 8:
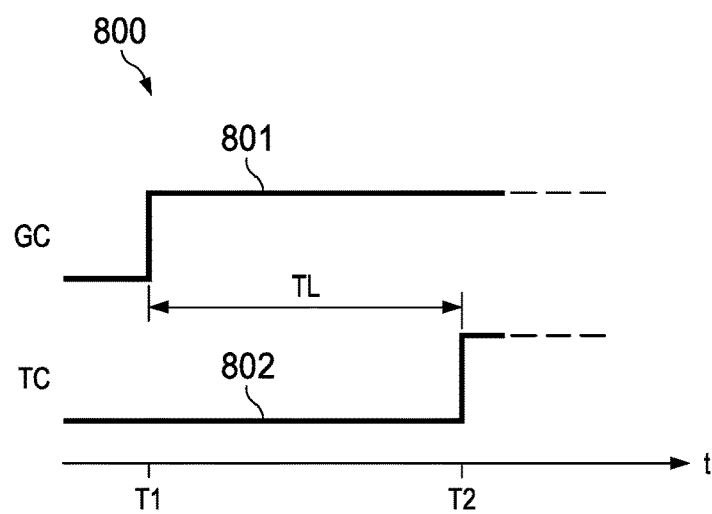
FIG. 8 is a graph of gate control and timing control signals generated by the control circuit in an implementation of the wafer probe test system of FIGS. 1 and 3-6 using the signal processing circuit of FIG. 7.
Figure 7:
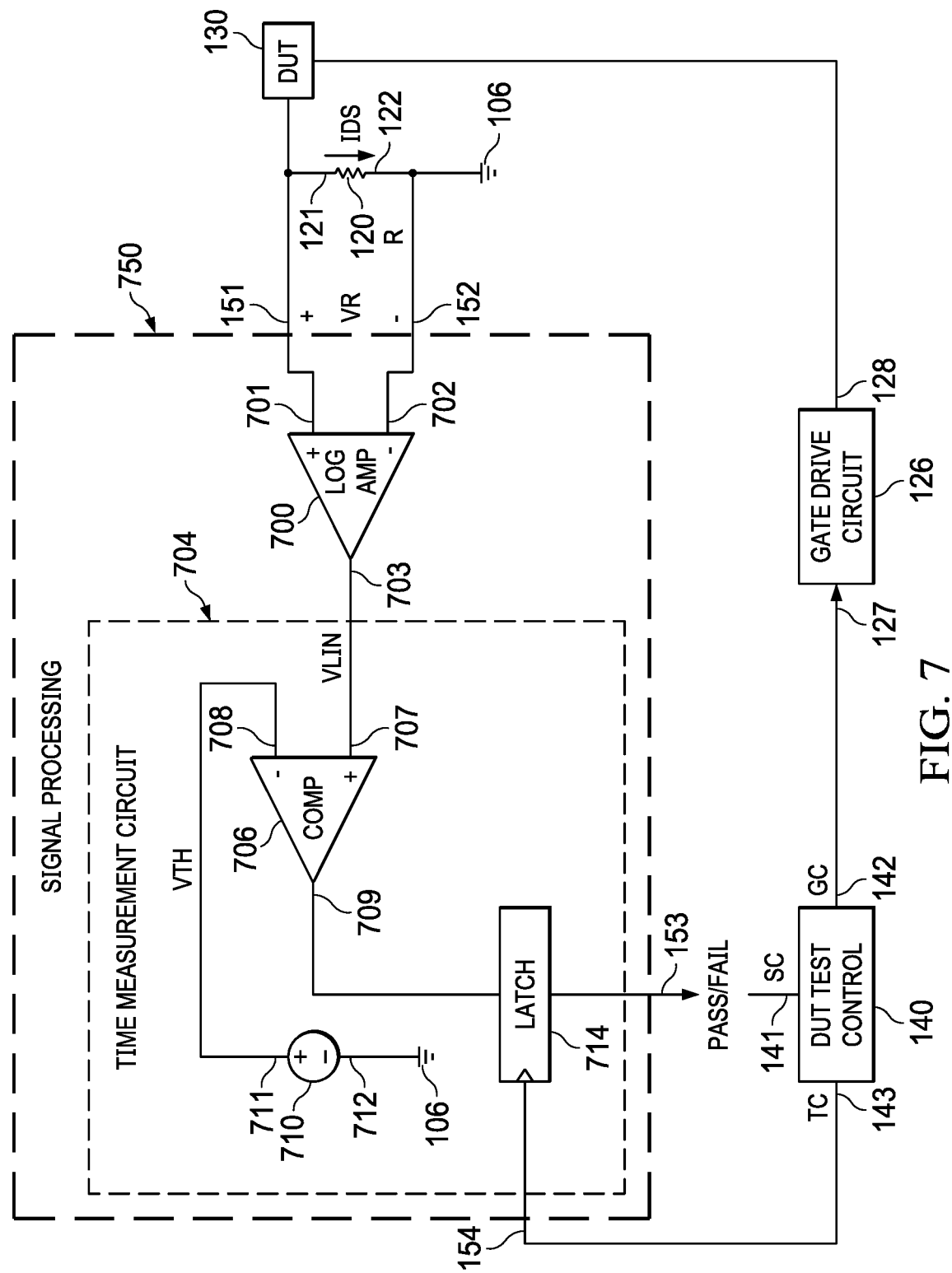
FIG. 7 is a schematic diagram of an example signal processing circuit in the wafer probe test system of FIGS. 1 and 3-6.
Figure 9:
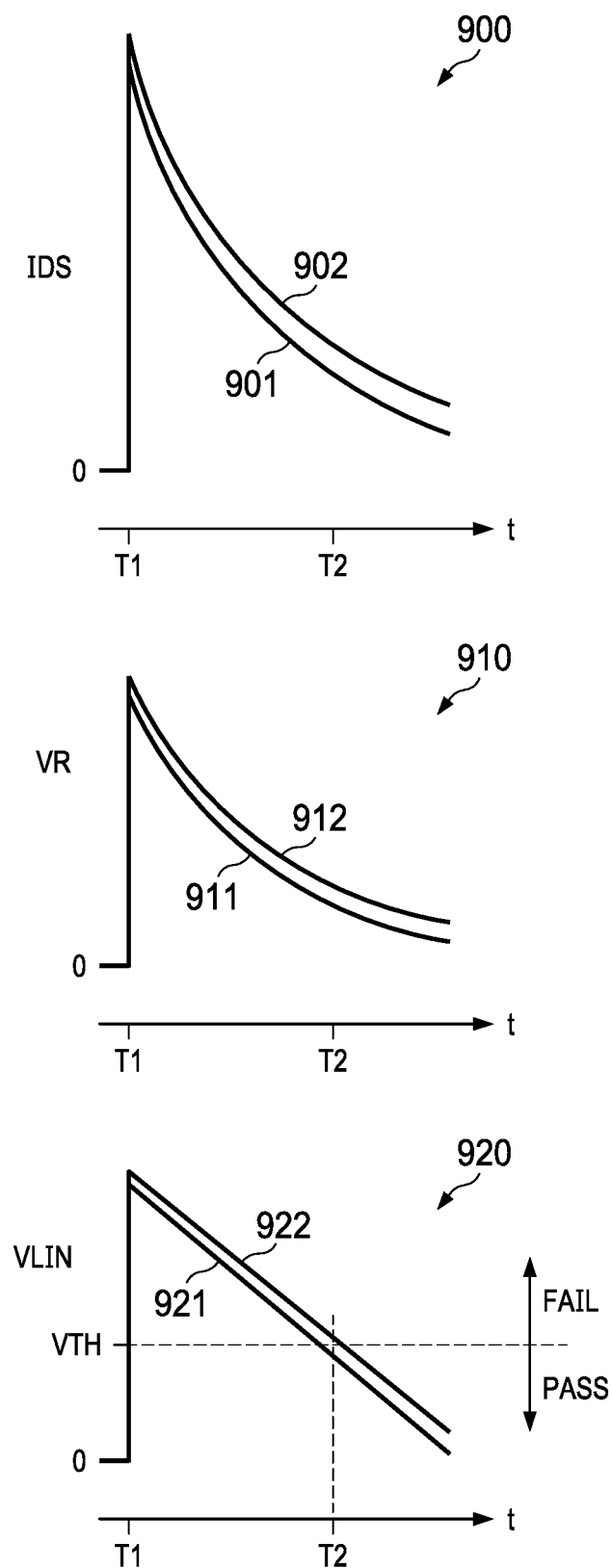
FIG. 9 is a graph of current and voltage signals in the wafer probe test system of FIGS. 1 and 3-6 using the signal processing circuit of FIG. 7.

Referring now to FIGS. 7-9, certain examples of the signal processing circuit 150 include a logarithmic amplifier (e.g., log amp) that converts the voltage going through the resistor 120 into a logarithm of that voltage, thereby compressing the range. A voltmeter or other voltage measuring instrument can digitize the output of the log amp, or the log amp output can be compared to a threshold voltage using a comparator circuit. Other arrangements are possible to characterize acceptance of the transistor dRON behavior in terms of voltage and/or time. FIG. 7 shows an example signal processing circuit 750 that is used as the signal processing circuit 150 in the wafer probe test system 100. FIG. 8 shows a graph of gate control and timing control signals generated by the control circuit 140 in an implementation using the signal processing circuit 750 of FIG. 7, and FIG. 9 shows a graph of current and voltage signals in the test system 100 using the signal processing circuit 750.

The signal processing circuit 750 in FIG. 7 includes a logarithmic amplifier 700 with a first amplifier input 701 (e.g., labeled "+" in FIG. 7), a second amplifier input 702

(e.g., labeled "−") and an amplifier output 703 that is coupled to a time measurement circuit 704. The first amplifier input 701 is coupled to the first terminal 121 of the resistor 120, and the second amplifier input 702 is coupled to the second terminal 122 of the resistor 120. The time measurement circuit 704 includes a comparator 706 with a first comparator input 707, a second comparator input 708 and a comparator output 709. The first comparator input 707 is coupled to the amplifier output 703. The second comparator input 708 is coupled to a second voltage source 710. The second voltage source 710 has a first terminal 711 that is coupled to provide a threshold voltage signal VTH to the second comparator input 708. The second voltage source 710 has a second terminal 712 coupled to the reference voltage node 106.

The graph 800 in FIG. 8 shows example gate control signal GC and an example timing control signal TC generated at the respective outputs 142 and 143 of the control circuit 140. The control circuit 140 activates the gate drive circuit 126 with an edge of the gate control signal GC at a first time T1, shown as curve 801 in FIG. 8. A predetermined latch time TL later, the control circuit activates the latch by providing a rising edge in the timing control signal TC at a second time T2 (the latch delay TL=T2−T1). The time measurement circuit 704 in this example also includes a latch 714 having a signal input, a signal output and a control input. The signal input of the latch 714 is coupled to the comparator output 709. The signal output of the latch 714 is coupled to the output 153 of the signal processing circuit 750 to provide the test result signal PASS/FAIL. The output 153 of the signal processing circuit 750 in this example generates the test result signal PASS/FAIL in response to an output signal at the comparator output 709 and in response to the timing control signal TC from the control circuit 140.

The signal processing circuit 750 in FIG. 7 determines the test result signal PASS/FAIL (e.g., 210 in the method 200 of FIG. 2) by creating a linearized voltage signal VLIN based on the voltage signal VR across the resistor 120, comparing the linearized voltage signal VLIN to the threshold voltage signal VTH using the comparator, and latching the comparator output at a predetermined time T2 after the transistor 130 is turned on at time T1. In this example, the signal processing circuit 750 determines the test result and generates the PASS/FAIL signal with a state to indicate an acceptable dynamic on-state resistance dRON of the transistor 130 if the linearized voltage signal VLIN is less than the threshold voltage signal VTH at the predetermined time T2. Otherwise, if the linearized voltage signal VLIN is greater than or equal to the threshold voltage signal VTH at the predetermined time T2, the signal processing circuit 750 determines the test result and generates the PASS/FAIL signal with a state that indicates an unacceptable dynamic on-state resistance dRON of the transistor 130. In this regard, an unacceptably high transistor on-state resistance dRON increases the time necessary to discharge the capacitor 114 through the transistor 130 and the resistor 120. Accordingly, the threshold voltage VTH and the predetermined time can be tailored for a given transistor type in order to differentiate transistors 130 that have acceptable and unacceptable dynamic on-state resistances dRON, for example, by knowing the capacitance C of the capacitor 114, the resistance R of the resistor 120, and the desired RDSON of the tested transistor 130.

A graph 900 in FIG. 9 includes example transistor current curve 901 and 902 (IDS) that exhibit nonlinear decrease from an initial high current value when the transistor 130 is turned on at T1. In this example, the curve 901 corresponds to a tested transistor 130 with an acceptable on-state resistance dRON, and the curve 902 corresponds to a tested transistor 130 with an unacceptable on-state resistance dRON. A graph 910 in FIG. 9 includes resistor voltage curves (VR) 911 and 912, where the voltage curve 911 corresponds to the current curve 901 of the graph 900, and the voltage curve 912 in the graph 910 corresponds to the current curve 902 in the graph 900. A graph 920 in FIG. 9 includes first and second linearized voltage curves 921 and 922 (VLIN). The first linearized voltage curve 921 corresponds to the log amp output for the first resistor voltage curve 911 in the graph 910. The second linearized voltage curve 922 in the graph 920 corresponds to the log amp output for the second resistor voltage curve 912 in the graph 910. As shown in the graph 920, moreover, the threshold voltage VTH in this example is set to a value corresponding to an acceptance threshold between the linearized voltage curve 921 and 922 at the time T2. In this manner, the signal processing circuit 750 latches the linearized voltage of a given tested transistor 130 at a fixed time T2 following the transistor 130 turning on at T1, and if the latched linearized voltage VLIN is less than the threshold VTH, the transistor 130 is identified as having an acceptable dynamic on-state resistance dRON. Otherwise, the transistor 130 is identified as having an unacceptable dynamic on-state resistance dRON if the latched linearized voltage VLIN is greater than or equal to the threshold voltage VTH.

Figure 10:
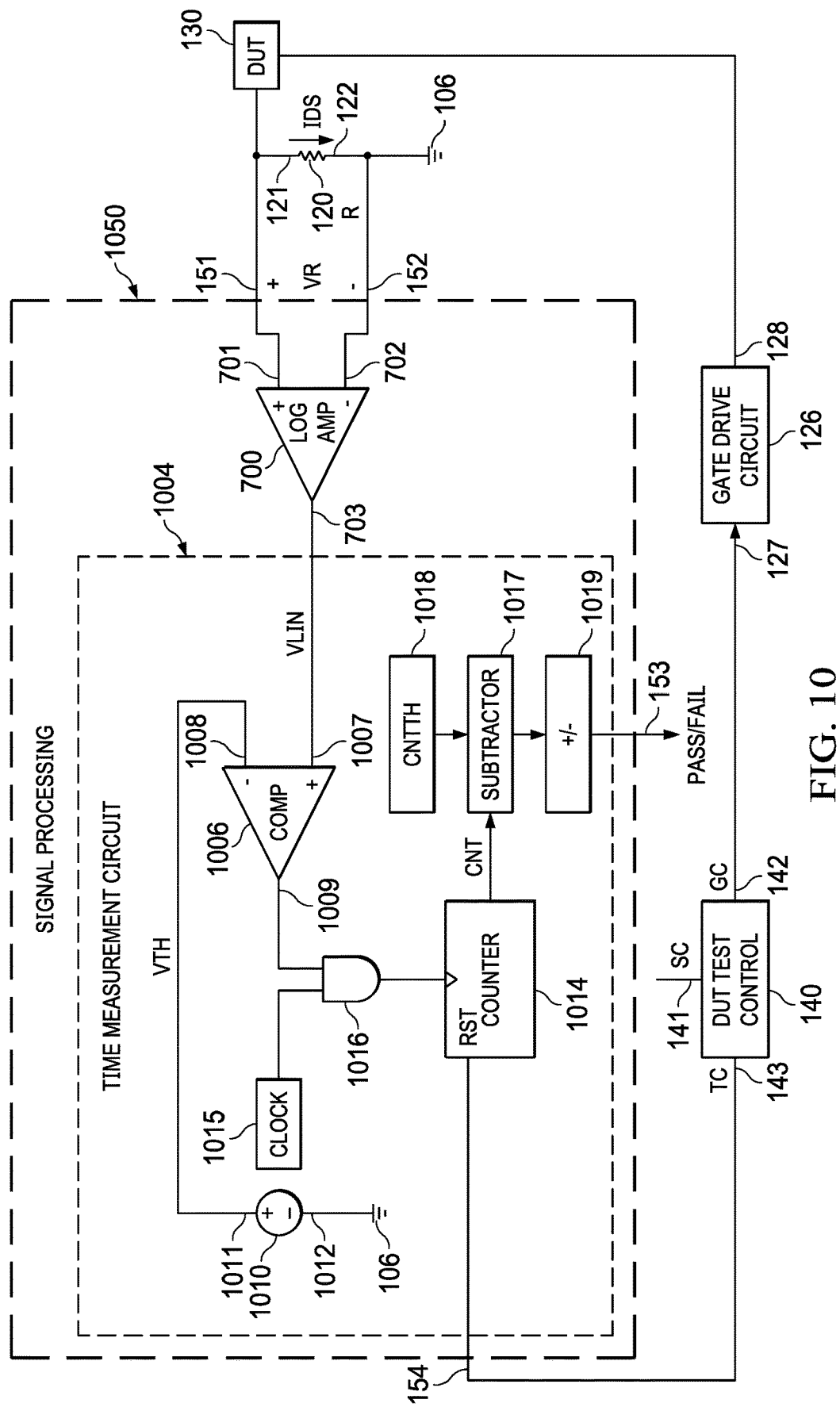
FIG. 10 is a schematic diagram of another example signal processing circuit in the wafer probe test system of FIGS. 1 and 3-6.
Figure 11:
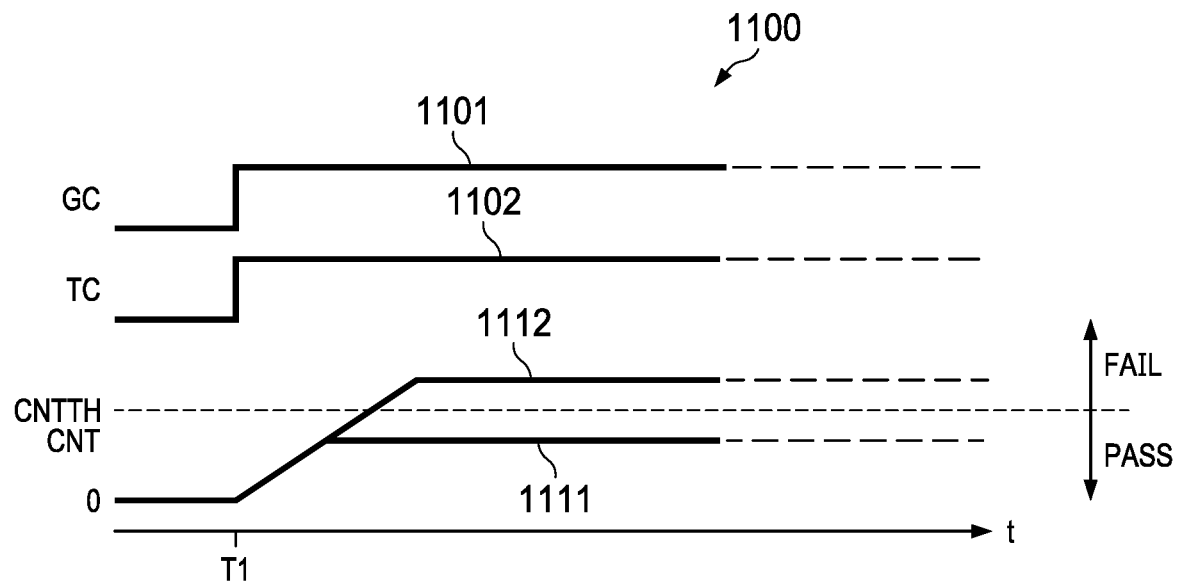
FIG. 11 is a graph of gate control and timing control signals, as well as counter values in another implementation of the wafer probe test system of FIGS. 1 and 3-6 using the signal processing circuit of FIG. 10.
Figure 12:
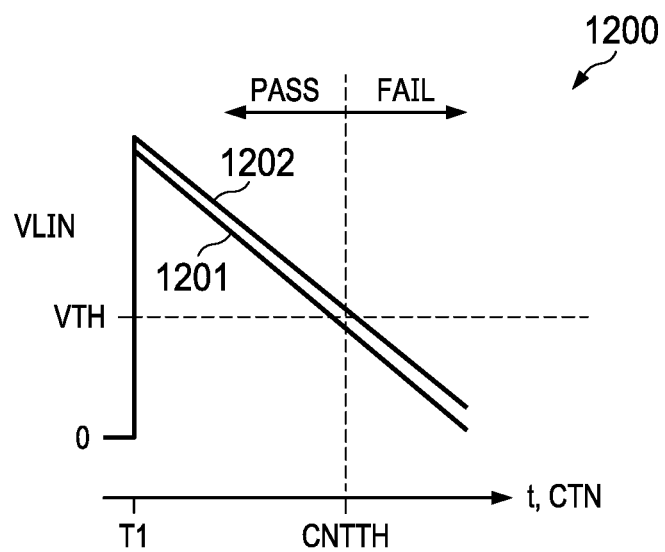
FIG. 12 is a graph of example voltage signals in the wafer probe test system of FIGS. 1 and 3-6 using the signal processing circuit of FIG. 10.

Referring now to FIGS. 10-12, FIG. 10 shows another example implementation of a signal processing circuit 1050 that is used as the signal processing circuit 150 in the wafer probe test system 100. This example includes the log amp 700 as described above in connection with FIG. 7 to characterize the dynamic on-state resistance dRON. Rather than assessing the linearized voltage VLIN at a predetermined time after the transistor 130 is turned on, the signal processing circuit 1050 in FIG. 10 characterizes the amount of time it takes for the linearized voltage signal VLIN to reach a predetermined voltage threshold. FIG. 11 shows a graph of gate control and timing control signals, as well as counter values in the wafer probe test system 100 using the signal processing circuit 1050 of FIG. 10, and FIG. 12 shows a graph of example voltage signals in the wafer probe test system 100 using the signal processing circuit 1050.

The signal processing circuit 1050 includes a time measurement circuit 1004 coupled to the amplifier output 703 to receive the linearized voltage signal VLIN. The time measurement circuit 1004 includes a comparator 1006 with a first comparator input 1007, a second comparator input 1008, and a comparator output 1009. The first comparator input 1007 is coupled to the amplifier output 703, and the second comparator input 1008 is coupled to a second voltage source 1010. The second voltage source 1010 has a first terminal 1011 that is coupled to provide a threshold voltage signal VTH to the second comparator input 1008. The second voltage source 1010 has a second terminal 1012 coupled to the reference voltage node 106. The output 153 of the signal processing circuit 1050 in this example generates the test result signal PASS/FAIL in response to an output signal at the comparator output 1009 and in response to the timing control signal TC from output third 143 of the control circuit 140.

The time measurement circuit 1004 includes a counter 1014, a clock source 1015, an AND gate 1016, a subtractor 1017, a count threshold register 1018 and a sign detector 1019 (labeled "+/−"). The timing circuit 1004 is coupled to the third output 143 of the control circuit 140 and to the comparator output 703. In operation, the timing circuit generates the test result signal PASS/FAIL at the output 153 of the signal processing circuit 1050 in response to the output signal at the comparator output 703 and the timing control signal TC from the control circuit 140. The output of the clock source 1015 is coupled to a first input of the AND gate 1016. A second input of the AND gate 1016 is coupled to the comparator output 1009. The output of the AND gate 1016 is coupled to a clock input of the counter 1014, and a reset (RST) input of the counter 1014 is coupled to the third output 143 of the control circuit 140 to receive the timing control signal TC.

FIG. 11 includes a graph 1100 with a curve 1101 showing the gate control signal GC, a curve 1102 showing the timing control signal TC, and counter value curves 1111 and 1112 showing two example counter values CNT at the output of the counter circuit 1014. In this example, the control circuit 140 activates the gate control signal GC (curve 1101) and the timing control signal TC (curve 1102) at the same time T1, which resets the counter 1014 when the transistor 130 is turned on. FIG. 12 shows a graph 1200 of linearized voltage curves 1201 and 1202 (VLIN). The first linearized voltage curve 1201 corresponds to the log amp output for a first transistor 130 with an acceptable dynamic on-state resistance dRON that corresponds to the counter value curve 1111. The curve 1202 in FIG. 12 corresponds to the curve 1112 in FIG. 11 for a log amp output during testing of a second transistor 130 with an unacceptable dynamic on-state resistance dRON.

The signal processing circuit 1050 in FIG. 10 determines the test result signal PASS/FAIL (e.g., 210 in the method 200 of FIG. 2) by creating the linearized voltage signal VLIN based on the voltage signal VR across the resistor 120 and comparing the linearized voltage signal VLIN to the threshold voltage signal VTH. Unlike the example of FIG. 7, however, the signal processing circuit 1050 uses the counter 1014 to determine the time at which the linearized voltage signal VLIN transitions below the threshold voltage signal VTH. If the time at which the linearized voltage signal VLIN transitions below the threshold voltage signal VTH is less than a predetermined time threshold CNTTH stored in the register 1018, the subtractor 1017 outputs a negative value, and the sign detector 1019 generates the test result signal PASS/FAIL indicating an acceptable dynamic on-state resistance dRON of the transistor 130. Otherwise, if the time at which the linearized voltage signal VLIN transitions below the threshold voltage signal VTH is greater than or equal to the predetermined time threshold CNTTH, the time measurement circuit 1004 determines the test result and generates the signal PASS/FAIL indicating an unacceptable dynamic on-state resistance dRON of the transistor 130.

In this example, the threshold voltage VTH and the predetermined time threshold CNTTH stored in the register 1018 can be tailored for a given transistor type in order to differentiate transistors 130 that have acceptable and unacceptable dynamic on-state resistances dRON, for example, by knowing the capacitance C of the capacitor 114, the resistance R of the resistor 120, and the desired RDSON of the tested transistor 130. As shown in FIG. 11, the counter threshold value CNTTH establishes the acceptance criteria to differentiate between the counter curves 1111 (pass) and 1112 (fail). This is further illustrated in the graph 1200 where the counter threshold time equivalent CNTTH and the threshold voltage VTH establish an objective criterion to differentiate between transistors 130 associated with a curve 1201 (pass) and 1202 (fail).

Figure 13:
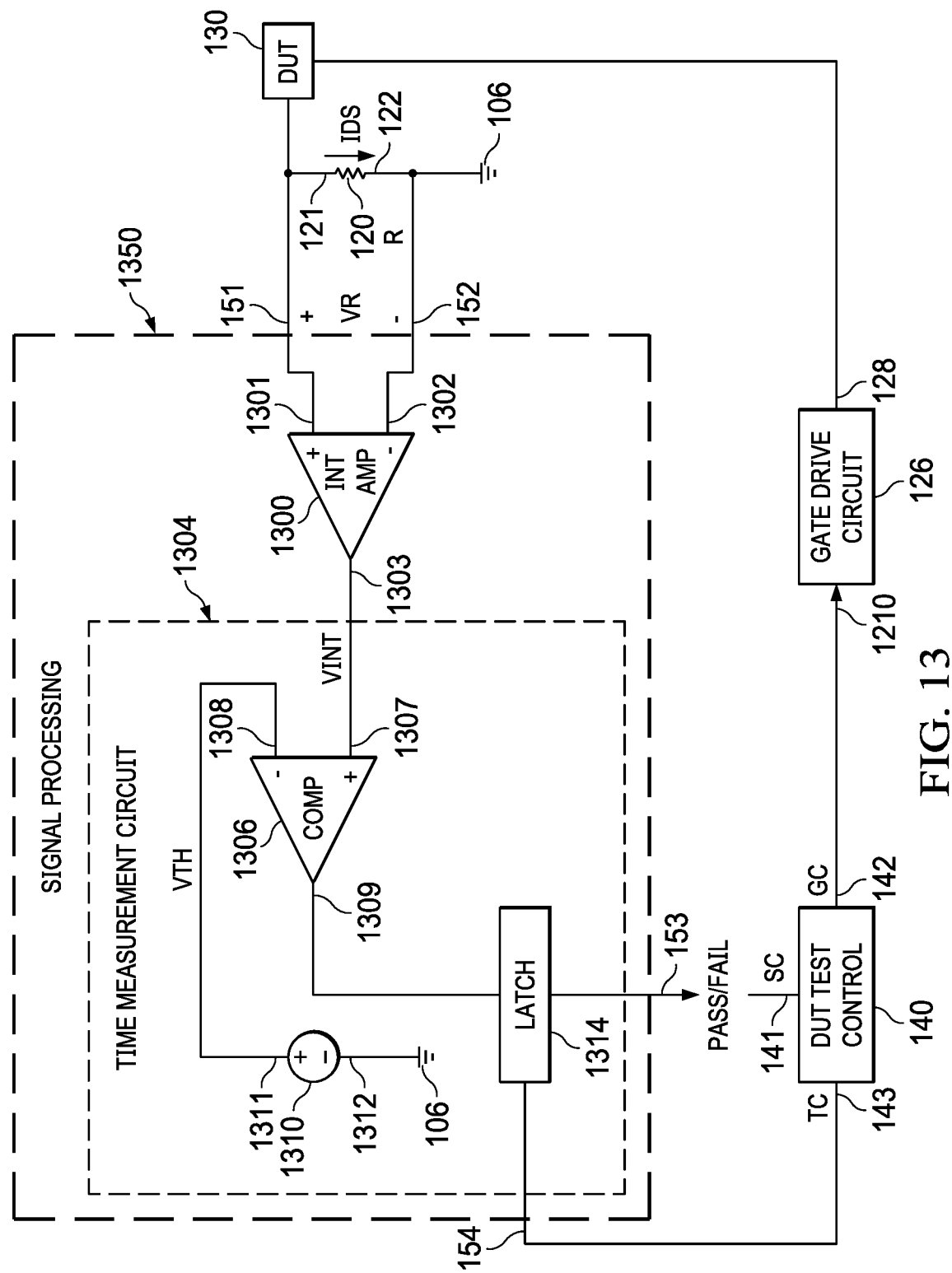
FIG. 13 is a schematic diagram of yet another example signal processing circuit in the wafer probe test system of FIGS. 1 and 3-6.
Figure 14:
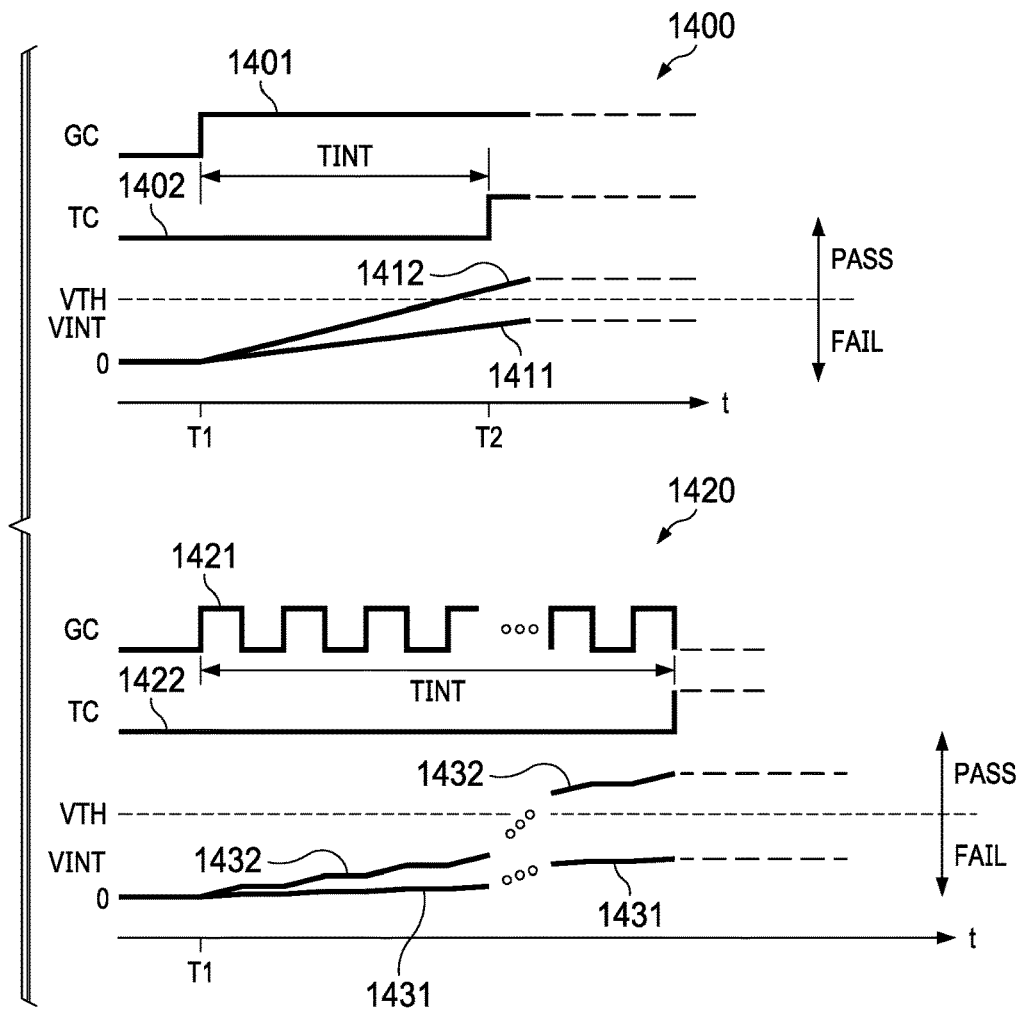
FIG. 14 is a graph of gate control and timing control signals, as well as an integrated voltage signal in another implementation of the wafer probe test system of FIGS. 1 and 3-6 using the signal processing circuit of FIG. 13.

Referring now to FIGS. 13 and 14, FIG. 13 shows another example signal processing circuit 1350 that can be used as the signal processing circuit 150 in the wafer probe test system 100 of FIGS. 1 and 3-6. FIG. 14 shows a graph of gate control and timing control signals, as well as an integrated voltage signal in another implementation of the wafer probe test system 100 using the signal processing circuit 1350 of FIG. 13. This example includes an integrating amplifier 1300 with a first amplifier input 1301 (e.g., labeled "+"), a second amplifier input 1302 (e.g., labeled "−"), and an amplifier output 1303 coupled to a time measurement circuit 1304. The first amplifier input 1301 is coupled to the first terminal 121 of the resistor 120, and the second amplifier input 1302 is coupled to the second terminal 122 of the resistor 120. The integrator amplifier output 1303 provides an integrated voltage signal VINT that is the integral of the resistor voltage signal VR.

The time measurement circuit 1304 in FIG. 13 includes a comparator 1306, a second voltage source 1310 and a latch 1314. The comparator 1306 has a first comparator input 1307, a second comparator input 1308, and a comparator output 1309. The first comparator input 1307 is coupled to the amplifier output 1303. The second comparator input 1308 is coupled to a second voltage source 1310. The second voltage source 1310 has a first terminal 1311 that is coupled to provide a threshold voltage signal VTH to the second comparator input 1308. The second voltage source 1310 has a second terminal 1312 coupled to the reference voltage node 106. The latch 1314 includes a signal input, a signal output, and a control input. The signal input of the latch 1314 is coupled to the comparator output 1309. The signal output of the latch 1314 is coupled to the output 153 of the signal processing circuit 1350 to generate the test result signal PASS/FAIL.

A graph 1400 in FIG. 14 includes a curve 1401 of an example gate control signal GC from the second output 142 of the control circuit 1400, and a curve 1402 of an example timing control signal TC from third output 143 of the control circuit 140. The control circuit 140 in this example activates the gate drive circuit 126 to turn the transistor 130 on by a rising edge of the gate control signal GC at time T1, and thereafter activates the latch 1314 by a rising edge in the timing control signal TC at a second time T2. In this implementation, the latch 1314 captures the comparator output signal a predetermined integration time TINT after the transistor 130 is turned on (TINT=T2−T1). The graph 1400 also includes two example integrated voltage signal curves 1411 and 1412 (VINT). The threshold voltage VTH is set at a level corresponding to the predetermined integration time TINT to differentiate between a transistor 130 with an unacceptable dRON shown by the integrated voltage curve 1411, and a transistor 130 having an acceptable dRON shown by the integrated voltage curve 1412. A further graph 1420 in FIG. 14 shows another example gate control signal curve 1421 (GC) and a timing control signal curve 1422 (TC), where the control circuit 140 in this example activates the gate control drive 126 to turn the transistor 130 on and off multiple times during the predetermined integration time TINT after the transistor 130 is initially turned on. In one implementation, the timing control signal TC is actuated once to control the sampling of the cumulative integrated voltage signal VINT by the latch 1314. The integrating amplifier 1300 integrates the voltage signal VR across the resistor 120 for the predetermined time TINT and the integration is effectively paused while the DUT transistor is turned off (e.g., the resistor voltage VR returns to zero). The integrating amplifier 1300 outputs the cumulative integrated voltage signal VINT, which is then sampled or latched by the latch 1314 after a predetermined integration time TINT set by the timing control signal TC. The resulting latched voltage is compared to the threshold VTH. FIG. 14 further shows two corresponding cumulative integrated voltage curves 1431 and 1432 (VINT) corresponding to respective unacceptable and acceptable packaged electronic device DUTs 130.

In these examples, the signal processing circuit 1350 determines the test result PASS/FAIL (e.g., 210 in the method 200 of FIG. 2) by integrating the voltage signal VR across the resistor 120 for the predetermined integration time TINT after the transistor 130 is initially turned on at T1 to create the integrated voltage signal VINT using the integrating amplifier 1300, and comparing the integrated voltage signal VINT to the threshold voltage signal VTH using the comparator 1306. If the integrated voltage signal VINT is less than the threshold voltage signal VTH when latched, the latch 1314 generates the test result signal PASS/FAIL with a state that indicates an unacceptable dynamic on-state resistance dRON of the transistor 130. In this case, the dynamic on-state resistance dRON limits the discharge current and slows down the rate of discharge of the capacitor 114. Otherwise, if integrated voltage signal VINT is greater than or equal to the threshold voltage signal VTH at the end of the predetermined integration time TINT, the latch 1314 generates the test result signal PASS/FAIL with a state that indicates an acceptable dynamic on-state resistance dRON of the transistor 130.

Figure 15:
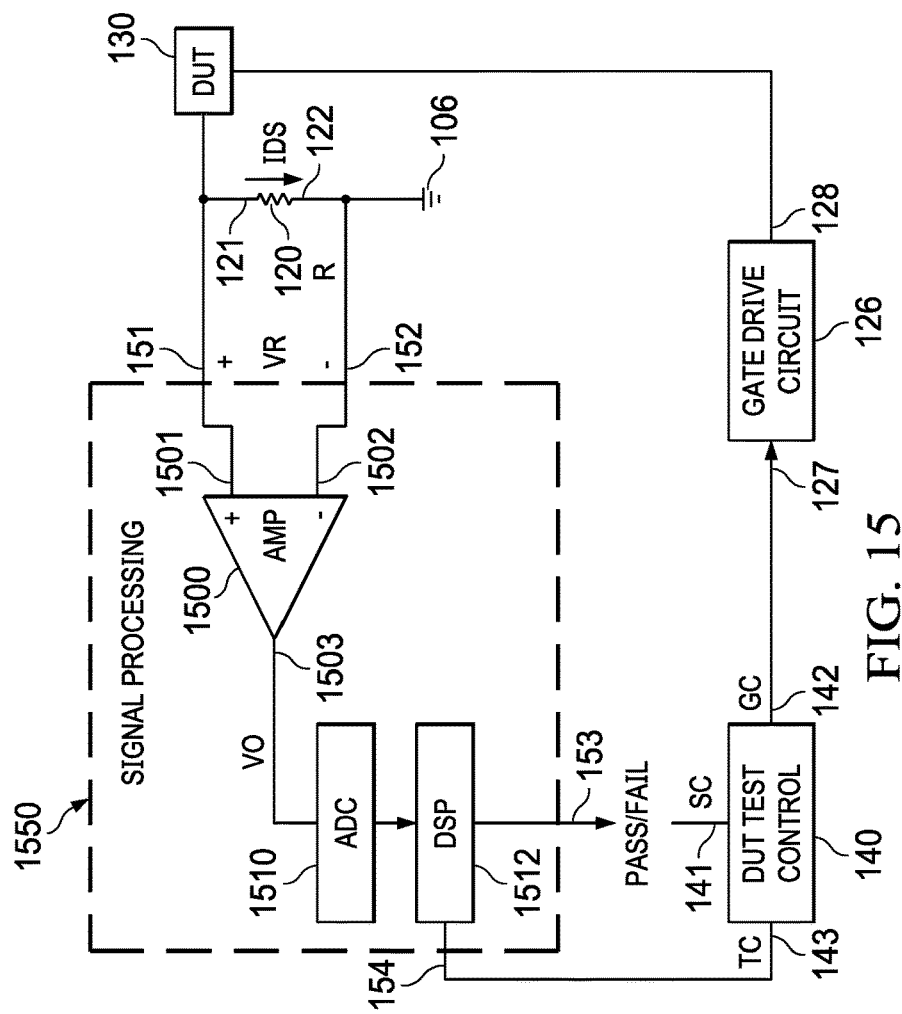
FIG. 15 is a schematic diagram of another example signal processing circuit in the wafer probe test system of FIGS. 1 and 3-6.

FIG. 15 shows another example signal processing circuit 1550 that can be used as the signal processing circuit 150 in the wafer probe test system 100 of FIGS. 1 and 3-6. The signal processing circuit 1550 includes an amplifier 1500, such as an op-amp, a logarithmic amplifier, an integrating amplifier, etc. The amplifier 1500 includes a first amplifier input 1501, a second amplifier input 1502, and an amplifier output 1503. The first amplifier input 1501 is coupled to the first terminal 121 of the resistor 120. The second amplifier input 1502 is coupled to the second terminal 122 of the resistor 120. The signal processing circuit 1550 in this example also includes an analog to digital converter (ADC) 1510 with an input coupled to the amplifier output 1503, as well as a processor 1512 coupled to the ADC 1510 (e.g., a digital signal processor labeled DSP in FIG. 15). The ADC 1510 samples an output voltage signal VO from the amplifier output 1503 and provides corresponding digital values to the processor 1512.

The processor 1512 is configured to generate the test result signal PASS/FAIL at the output 153 of the signal processing circuit 1550 in response to converted digital values from the ADC 1510 and in response to the timing control signal TC from the control circuit 140. The processor 1512 in one example receives the timing control signal TC from the control circuit 140 at the time when the transistor 130 is turned on, and stores converted digital values from the ADC 1510 in an associated electronic memory. The processor 1512 in one example executes program instructions from the associated electronic memory to analyze the stored converted digital values and determine the test result according to the converted digital values from the ADC 1510 and the timing control signal TC.

In one implementation, the processor 1512 is configured to implement comparisons of the digital values with one or more thresholds, as well as timing functions and/or time comparisons to compare the voltage is represented by the digital values with one or more thresholds at one or more corresponding times, and/or to determine one or more times at which the digital values reach one or more respective thresholds, in order to assess the dynamic on-state resistance dRON of the transistor 130. In certain examples, the processor 1512 is configured to implement the comparisons described above in connection with one or more of the circuit examples of FIGS. 7, 10 and/or 13.

Figure 16:
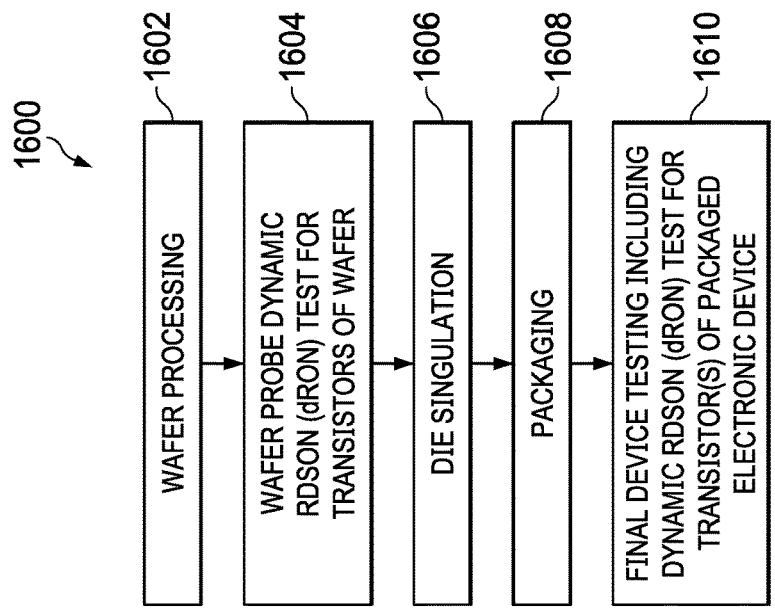
FIG. 16 is a flow diagram of a method of fabricating a packaged electronic device.

FIG. 16 shows a method 1600 of fabricating a packaged electronic device. The method includes processing a wafer at 1602 to fabricate a transistor (e.g., transistor 130 in the processed wafer DUT 134 of FIG. 1 above). At 1604, in one example, the method includes wafer probe testing, for example, dynamic RDSON (dRON) testing as described above for one or more transistors 130 of the wafer 134. The wafer probe testing at 1604 in one example includes processing as described above in connection with FIG. 2, including coupling (e.g., 201 in FIG. 2) the transistor 130 in a series circuit with a capacitor 114 and a resistor 120, coupling a voltage source 102 to the capacitor 114 (e.g., 202 in FIG. 2) to charge the capacitor 114 to a non-zero DC voltage VDC while the transistor 130 is turned off, and disconnecting (e.g., 204 in FIG. 2) the voltage source 102 from the capacitor 114 while the transistor 130 is turned off. This testing further includes turning the transistor 130 on (e.g., 206 in FIG. 2) while the voltage source 102 is disconnected from the capacitor 114, measuring a voltage signal VR across the resistor 120 (e.g., 208 in FIG. 2) while the transistor 130 is turned on, and determining (e.g., 210 in FIG. 2) the test result PASS/FAIL indicating whether the transistor 130 has an acceptable dynamic on-state resistance dRON according to the voltage signal VR across the resistor 120. The method 1600 in this example continues with die singulation or separation at 1606 to separate individual dies from the starting wafer 134, followed by packaging at 1608 to construct packaged electronic devices with one or more of the dies separated from the starting wafer 134.

In one or more examples, the method 1600 also includes final device testing at 1610, for example, including dRON testing of one or more transistors 130 of individual packaged electronic device products according to the method 200 and FIG. 2. In one implementation, the final testing at 1610 includes installing to packaged electronic device into a socket of a final test system to couple the transistor 130 in a series circuit with a capacitor 114 and a resistor 120 of the test circuit 101, and performing automated dRON testing as described above. In one implementation, the above described tests circuits 101 and associated signal processing circuits are used at one or both of the wafer probe testing at 1604 and/or the final device testing at 1610 to determine whether a tested transistor 130 has acceptable dRON performance, for example, according to the process 200 described above in connection with FIG. 2.

In one implementation, the determination at 1604 and/or 1610 of the test result (e.g., pass or fail) includes creating the linearized voltage signal VLIN based on the voltage signal VR across the resistor 120, as well as comparing the linearized voltage signal VLIN to a threshold voltage signal VTH at a predetermined time T2 after the transistor 130 is turned on T1 (e.g., as described above in connection with the example of FIGS. 7-9). In another implementation, the determination at 1604 and/or 1610 of the test result includes creating the linearized voltage signal VLIN based on the voltage signal VR across the resistor 120 and comparing the linearized voltage signal VLIN to a threshold voltage signal VTH, and determining a time at which the linearized voltage signal VLIN transitions below the threshold voltage signal VTH (e.g., as described above in connection with FIGS. 10-12). In yet another implementation, the determination at 1604 and/or 1610 of the test result includes integrating the voltage signal VR across the resistor 120 for a predetermined time TINT after the transistor 130 is turned on at T1 to create an integrated voltage signal VINT and comparing the integrated voltage signal VINT to a threshold voltage signal VTH (e.g., as described above in connection with FIGS. 13 and 14.

Figure 18:
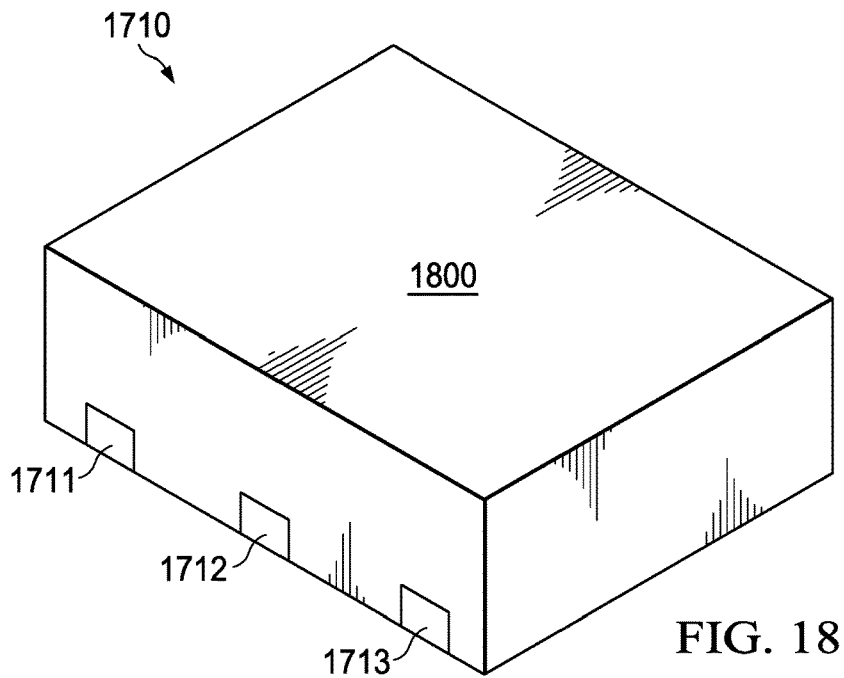
FIG. 18 is a perspective view of a packaged electronic device fabricated according to the method of FIG. 16.
Figure 17:
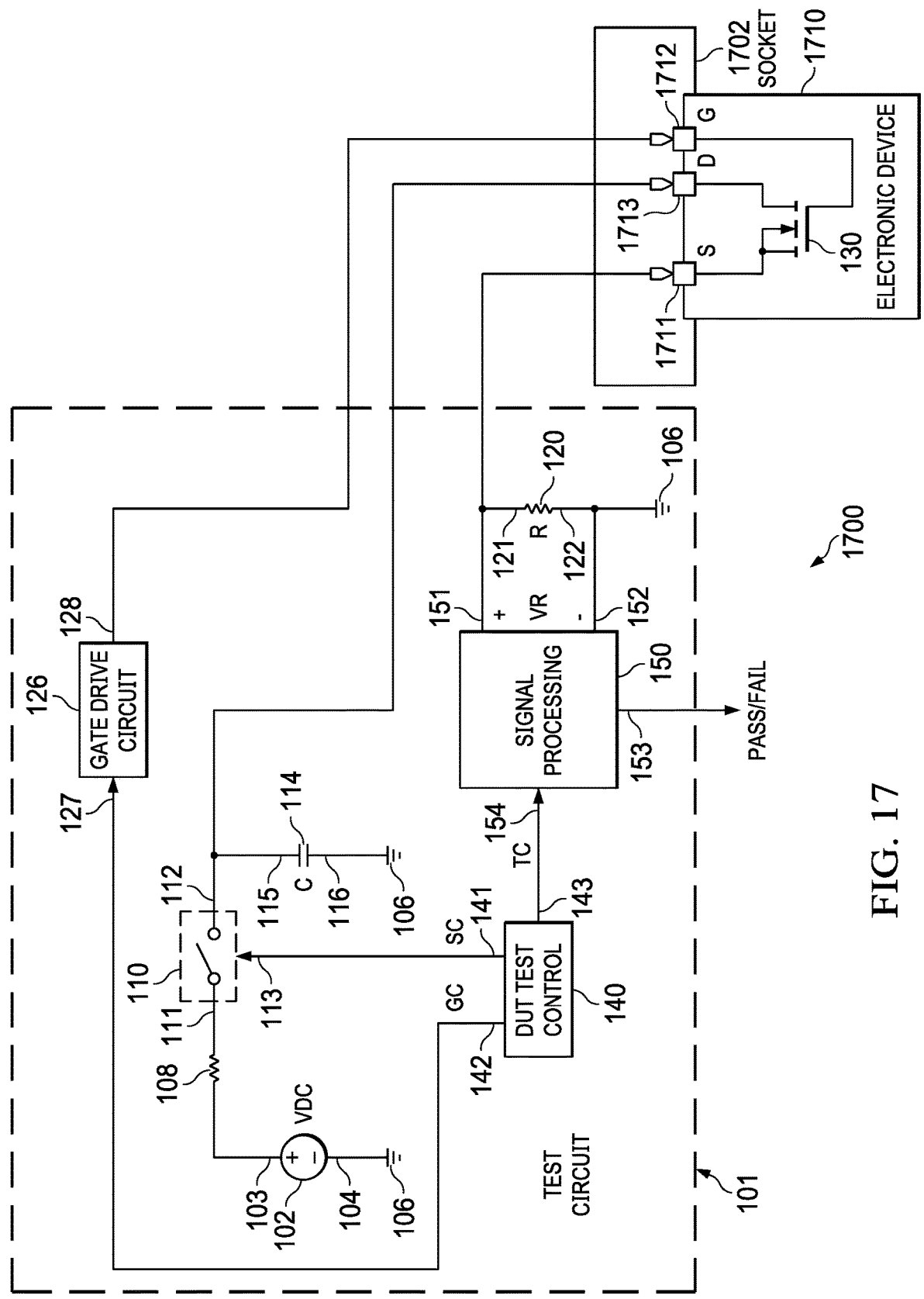
FIG. 17 is a schematic diagram of an example final device test system for testing transistors of a packaged electronic device (DUT).

FIG. 17 shows an example final device test system 1700 which can be used at 1610 in the method 1600 of FIG. 16 to test transistors of a packaged electronic device DUT 1710. The system 1700 includes the test circuit 101 as described above, as well as a socket 1702 with electrical contacts to couple to leads 1711, 1712 and 1713 of an installed packaged electronic device 1710 for electrically coupling a transistor 130 of the installed packaged electronic device 1710 to the test circuit 101. FIG. 18 shows one example of the finished packaged electronic device 1710 manufactured according to the method 1600 of FIG. 16. The packaged electronic device 1710 includes a molded or ceramic package structure 1800 with conductive leads 1711, 1712 and 1713 for the example transistor source (1711), gate (1712) and drain (1713). The socket 1702 in FIG. 17 is adapted to engage the packaged electronic device 1710. When engaged as shown in FIG. 17, the packaged electronic device leads 1711, 1712 and 1713 are coupled to respective ones of the second contact terminal 112, the first terminal 121 of the resistor 120, and the output 128 of the gate drive circuit 126.

The described examples provide transistor dynamic on-state resistance testing apparatus and methods, as well as semiconductor device manufacturing techniques that provide scalable fast screening for dRON at wafer probe and/or final test. The examples facilitate testing using capacitive hard-switching and realistic high voltage switching without requiring special test equipment or the use of multiple power supplies to determine a pass or fail test result for individual transistors 130 of a processed wafer DUT 134 and/or of a final packaged device DUT 1710. The example test circuit 101 provides for voltage measurement of a sense resistor 120 without directly measuring the drain-source voltage of a FET, while allowing high precision delineation between transistors 130 with acceptable and unacceptable dynamic RDSON (dRON). Certain implementations also allow contemporaneous measurement of static RDSON using the test circuit 101. The apparatus and techniques of the described examples can be used for any type or form of transistor, and facilitate detection of unacceptably high dRON by discharging the capacitor 114 and digitizing or otherwise processing the current passing through the DUT FET with a logarithmic amp, an integrating amp, or other amplifier with an ADC and processor. These examples allow the use of a single high voltage low current instrument, while avoiding or mitigating issues with high voltage tolerance and dynamic range on an instrument by only looking at the transistor current IDS, and allowing testing of a given transistor 130 in a few milliseconds. The disclosed techniques and apparatus facilitate full coverage testing of transistors during manufacturing without any significant cost increase, and without requiring clamp circuitry for the digitizing instrument to handle a wide range of operational voltages.

The above examples are merely illustrative of several possible implementations of various aspects of the present disclosure, wherein equivalent alterations and/or modifications will occur to others skilled in the art upon reading and understanding this specification and the annexed drawings. Modifications are possible in the described examples, and other implementations are possible, within the scope of the claims.

What is claimed is:

1. A test system, comprising:
a voltage source having a first terminal and a second terminal, the second terminal of the voltage source being coupled to a reference voltage node;
a switch circuit having a contact and a control input, the contact including a first contact terminal and a second contact terminal, the second contact terminal adapted to be coupled to a first terminal of a transistor of a device under test;
a capacitor having a first terminal and a second terminal, the first terminal of the capacitor being coupled to the second contact terminal, and the second terminal of the capacitor being coupled to the reference voltage node;
a resistor having a first terminal and a second terminal, the first terminal of the resistor adapted to be coupled to a second terminal of the transistor, and the second terminal of the resistor being coupled to the reference voltage node;
a gate drive circuit having a control input and an output, the output of the gate drive circuit adapted to be coupled to a gate terminal of the transistor;
a signal processing circuit having a first input, a second input, an output, and a control input, the first input of the signal processing circuit being coupled to the first terminal of the resistor, and the second input of the signal processing circuit being coupled to the second terminal of the resistor; and
a control circuit having a first output, a second output and a third output, the first output of the control circuit being coupled to the control input of the switch circuit, the second output of the control circuit being coupled to the control input of the gate drive circuit, and the third output of the control circuit being coupled to the control input of the signal processing circuit.

2. The test system of claim 1, wherein:
the first output of the control circuit is configured to deliver a switch control signal to the control input of the switch circuit to: (1) close the contact and couple the first terminal of the voltage source to the first terminal of the capacitor to charge the capacitor while the transistor is turned off, and (2), after the capacitor is charged, open the contact to disconnect the first terminal of the voltage source from the first terminal of the capacitor while the transistor is turned off;
the second output of the control circuit is configured to deliver a gate control signal to the control input of the gate drive circuit to cause the gate drive circuit to turn the transistor on after the capacitor is charged and while the contact of the switch circuit is open to allow a current signal from the first terminal of the capacitor through the transistor and through the resistor to develop a voltage signal across the resistor;
the third output of the control circuit is configured to deliver a timing control signal to the control input of the signal processing circuit at a fixed temporal relationship to the gate control signal; and
the output of the signal processing circuit is configured to generate a test result signal having one of a first state and a second state in response to the voltage signal across the resistor and the timing control signal, the first state indicating an acceptable dynamic on-state resistance of the transistor, and the second state indicating an unacceptable dynamic on-state resistance of the transistor.

3. The test system of claim 1, wherein the signal processing circuit includes an amplifier having a first amplifier input, a second amplifier input, and an amplifier output, the first amplifier input being coupled to the first terminal of the resistor, the second amplifier input being coupled to the second terminal of the resistor.

4. The test system of claim 3, wherein:
the amplifier is a logarithmic amplifier;
the signal processing circuit further comprises:
   a comparator having a first comparator input, a second comparator input, and a comparator output, the first comparator input being coupled to the amplifier output, and the second comparator input being coupled to a second voltage source; and
the output of the signal processing circuit is configured to generate a test result signal in response to an output signal at the comparator output and a timing control signal from the control circuit.

5. The test system of claim 4, wherein the signal processing circuit further comprises a latch having a signal input, a signal output, and a control input, the signal input of the latch being coupled to the comparator output, and the signal output of the latch being coupled to the output of the signal processing circuit.

6. The test system of claim 4, wherein the signal processing circuit further comprises a timing circuit coupled to the third output of the control circuit and to the comparator output, the timing circuit configured to generate a test result signal at the output of the signal processing circuit in response to an output signal at the comparator output and a timing control signal from the control circuit.

7. The test system of claim 3, wherein:
the amplifier is an integrating amplifier; and
the signal processing circuit further comprises:
   a comparator having a first comparator input, a second comparator input, and a comparator output, the first comparator input being coupled to the amplifier output, and the second comparator input being coupled to a second voltage source; and
   a latch having a signal input, a signal output, and a control input, the signal input of the latch being coupled to the comparator output, and the signal output of the latch being coupled to the output of the signal processing circuit.

8. The test system of claim 3, wherein the signal processing circuit further comprises:
an analog to digital converter (ADC) having an input coupled to the amplifier output; and
a processor coupled to the ADC, the processor configured to generate a test result signal at the output of the signal processing circuit in response to converted digital values from the ADC and a timing control signal from the control circuit.

9. The test system of claim 1, comprising: a wafer probe tester having a test circuit that includes the voltage source, the switch circuit, the capacitor, the resistor, the gate drive circuit, the signal processing circuit, and the control circuit; and wafer probe pins coupled to respective ones of the second contact terminal, the first terminal of the resistor, and the output of the gate drive circuit.

10. The test system of claim 1, comprising: a socket adapted to engage a packaged electronic device, the socket having conductive contacts coupled to respective ones of the second contact terminal, the first terminal of the resistor, and the output of the gate drive circuit.

11. A method, comprising:
coupling a transistor in a series circuit with a capacitor and a resistor;
coupling a voltage source to the capacitor to charge the capacitor to a non-zero DC voltage while the transistor is turned off;
disconnecting the voltage source from the capacitor while the transistor is turned off;
turning the transistor on while the voltage source is disconnected from the capacitor;
measuring a voltage signal across the resistor while the transistor is turned on; and
determining a test result indicating whether the transistor has an acceptable dynamic on-state resistance according to the voltage signal across the resistor.

12. The method of claim 11, wherein determining the test result comprises:
creating a linearized voltage signal based on the voltage signal across the resistor;
comparing the linearized voltage signal to a threshold voltage signal at a predetermined time after the transistor is turned on;
if the linearized voltage signal is less than the threshold voltage signal at the predetermined time, determining the test result indicating an acceptable dynamic on-state resistance of the transistor; and
if the linearized voltage signal is greater than or equal to the threshold voltage signal at the predetermined time, determining the test result indicating an unacceptable dynamic on-state resistance of the transistor.

13. The method of claim 11, wherein determining the test result comprises:
creating a linearized voltage signal based on the voltage signal across the resistor;
comparing the linearized voltage signal to a threshold voltage signal;
determining a time at which the linearized voltage signal transitions below the threshold voltage signal;
if the time at which the linearized voltage signal transitions below the threshold voltage signal is less than a predetermined time threshold, determining the test result indicating an acceptable dynamic on-state resistance of the transistor; and
if the time at which the linearized voltage signal transitions below the threshold voltage signal is greater than or equal to the predetermined time threshold, determining the test result indicating an unacceptable dynamic on-state resistance of the transistor.

14. The method of claim 11, wherein determining the test result comprises:
integrating the voltage signal across the resistor for a predetermined time after the transistor is turned on to create an integrated voltage signal;
comparing the integrated voltage signal to a threshold voltage signal;
if the integrated voltage signal is less than the threshold voltage signal, determining the test result indicating an unacceptable dynamic on-state resistance of the transistor; and
if the integrated voltage signal is greater than or equal to the threshold voltage signal, determining the test result indicating an acceptable dynamic on-state resistance of the transistor.

15. The method of claim 14, comprising:
turning the transistor on and off multiple times and integrating the voltage signal across the resistor for the predetermined time after the transistor is initially turned on to create the integrated voltage signal.

16. A method of manufacturing an electronic device, the method comprising:
processing a wafer to fabricate a transistor on or in the wafer;

separating a die from the wafer, the die including the transistor;

packaging the die to create a packaged electronic device;

coupling the transistor in a series circuit with a capacitor and a resistor;

coupling a voltage source to the capacitor to charge the capacitor to a non-zero DC voltage while the transistor is turned off;

disconnecting the voltage source from the capacitor while the transistor is turned off;

turning the transistor on while the voltage source is disconnected from the capacitor;

measuring a voltage signal across the resistor while the transistor is turned on; and determining a test result indicating whether the transistor has an acceptable dynamic on-state resistance according to the voltage signal across the resistor.

17. The method of claim 16, wherein determining the test result comprises:

creating a linearized voltage signal based on the voltage signal across the resistor;

comparing the linearized voltage signal to a threshold voltage signal at a predetermined time after the transistor is turned on;

if the linearized voltage signal is less than the threshold voltage signal at the predetermined time, determining the test result indicating an acceptable dynamic on-state resistance of the transistor; and if the linearized voltage signal is greater than or equal to the threshold voltage signal at the predetermined time, determining the test result indicating an unacceptable dynamic on-state resistance of the transistor.

18. The method of claim 16, wherein determining the test result comprises:

creating a linearized voltage signal based on the voltage signal across the resistor;

comparing the linearized voltage signal to a threshold voltage signal;

determining a time at which the linearized voltage signal transitions below the threshold voltage signal;

if the time at which the linearized voltage signal transitions below the threshold voltage signal is less than a predetermined time threshold, determining the test result indicating an acceptable dynamic on-state resistance of the transistor; and if the time at which the linearized voltage signal transitions below the threshold voltage signal is greater than or equal to the predetermined time threshold, determining the test result indicating an unacceptable dynamic on-state resistance of the transistor.

19. The method of claim 16, wherein determining the test result comprises:

integrating the voltage signal across the resistor for a predetermined time after the transistor is turned on to create an integrated voltage signal;

comparing the integrated voltage signal to a threshold voltage signal;

if the integrated voltage signal is less than the threshold voltage signal, determining the test result indicating an unacceptable dynamic on-state resistance of the transistor; and if the integrated voltage signal is greater than or equal to the threshold voltage signal, determining the test result indicating an acceptable dynamic on-state resistance of the transistor.

20. The method of claim 16, comprising performing a wafer probe test of the wafer, the wafer probe test including determining the test result indicating whether the transistor has an acceptable dynamic on-state resistance according to the voltage signal across the resistor.

21. The method of claim 16, comprising performing a final device test of the packaged electronic device, the final device test including determining the test result indicating whether the transistor has an acceptable dynamic on-state resistance according to the voltage signal across the resistor.

22. A method of manufacturing an electronic device, the method comprising:

processing a wafer to fabricate a transistor on or in the wafer;

coupling the transistor in a series circuit with a capacitor and a resistor;

coupling a voltage source to the capacitor to charge the capacitor to a non-zero DC voltage while the transistor is turned off;

disconnecting the voltage source from the capacitor while the transistor is turned off;

turning the transistor on while the voltage source is disconnected from the capacitor;

measuring a voltage signal across the resistor while the transistor is turned on; and determining a test result indicating whether the transistor has an acceptable dynamic on-state resistance according to the voltage signal across the resistor.

23. The method of claim 22, wherein determining the test result comprises:

creating a linearized voltage signal based on the voltage signal across the resistor;

comparing the linearized voltage signal to a threshold voltage signal at a predetermined time after the transistor is turned on;

if the linearized voltage signal is less than the threshold voltage signal at the predetermined time, determining the test result indicating an acceptable dynamic on-state resistance of the transistor; and if the linearized voltage signal is greater than or equal to the threshold voltage signal at the predetermined time, determining the test result indicating an unacceptable dynamic on-state resistance of the transistor.

24. The method of claim 22, wherein determining the test result comprises:

creating a linearized voltage signal based on the voltage signal across the resistor;

comparing the linearized voltage signal to a threshold voltage signal;

determining a time at which the linearized voltage signal transitions below the threshold voltage signal;

if the time at which the linearized voltage signal transitions below the threshold voltage signal is less than a predetermined time threshold, determining the test result indicating an acceptable dynamic on-state resistance of the transistor; and if the time at which the linearized voltage signal transitions below the threshold voltage signal is greater than or equal to the predetermined time threshold, determining the test result indicating an unacceptable dynamic on-state resistance of the transistor.

25. The method of claim 22, wherein determining the test result comprises:

integrating the voltage signal across the resistor for a predetermined time after the transistor is turned on to create an integrated voltage signal;

comparing the integrated voltage signal to a threshold voltage signal;

if the integrated voltage signal is less than the threshold voltage signal, determining the test result indicating an unacceptable dynamic on-state resistance of the transistor; and if the integrated voltage signal is greater than or equal to the threshold voltage signal, determining the test result indicating an acceptable dynamic on-state resistance of the transistor.

26. The method of claim 22, wherein the determining a test result is part of a wafer probe test of the wafer, the wafer probe test.

27. The method of claim 22, further including testing additional transistors on or in the wafer.

28. The method of claim 27, wherein if the test result indicates that the transistors have an acceptable dynamic on-state resistance according to the voltage signal across the resistor:

separate dies from the wafer; and package the dies to create respective packaged electronic devices.

29. The method of claim 27, comprising performing a final device test of the packaged electronic devices, the final device test including determining the test result indicating whether the transistors have an acceptable dynamic on-state resistance according to the voltage signal across the resistor.

30. The method of claim 22, wherein if the test result indicates that the transistor has an acceptable dynamic on-state resistance according to the voltage signal across the resistor:

separate the die from the wafer; and package the die to create a respective packaged electronic device.

31. The method of claim 22, comprising performing a final device test of the packaged electronic device, the final device test including determining the test result indicating whether the transistor has an acceptable dynamic on-state resistance according to the voltage signal across the resistor.

* * * * *